US012787881B2

(12) United States Patent
Taddiken et al.

(10) Patent No.: US 12,787,881 B2
(45) Date of Patent: Nov. 3, 2026

(54) 3D-IC FOR RF APPLICATIONS

(71) Applicant: Infineon Technologies AG, Neubiberg (DE)

(72) Inventors: Hans Taddiken, Munich (DE); Christoph Kadow, Gauting (DE); Anton Steltenpohl, Munich (DE)

(73) Assignee: Infineon Technologies AG, Neubiberg (DE)

( * ) Notice: Subject to any disclaimer, the term of this patent is extended or adjusted under 35 U.S.C. 154(b) by 351 days.

(21) Appl. No.: 18/509,751

(22) Filed: Nov. 15, 2023

(65) Prior Publication Data

US 2025/0157988 A1 May 15, 2025

(51) Int. Cl.

*H10W 74/43* (2026.01)
*H10W 74/10* (2026.01)
*H10W 80/00* (2026.01)
*H10W 90/00* (2026.01)
*H10W 72/00* (2026.01)
*H10W 90/20* (2026.01)

(52) U.S. Cl.

CPC ......... *H10W 90/00* (2026.01); *H10W 74/147* (2026.01); *H10W 74/43* (2026.01); *H10W 80/011* (2026.01); *H10W 80/327* (2026.01); *H10W 72/0198* (2026.01); *H10W 72/07307* (2026.01); *H10W 90/288* (2026.01); *H10W 90/792* (2026.01)

(58) Field of Classification Search

CPC ............... H10W 90/00; H10W 74/147; H10W 72/07307; H10W 80/327; H10W 90/288; H10W 90/792

See application file for complete search history.

(56) References Cited

U.S. PATENT DOCUMENTS

| | | | |
|---|---|---|---|
| 8,441,134 | B2 | 5/2013 | Kuo et al. |
| 8,466,036 | B2 | 6/2013 | Brindle et al. |
| 8,481,405 | B2 | 7/2013 | Arriagada et al. |
| 8,536,021 | B2 | 9/2013 | Arriagada et al. |
| 8,581,398 | B2 | 11/2013 | Arriagada et al. |
| 8,748,245 | B1 | 6/2014 | Stuber et al. |
| 8,835,281 | B2 | 9/2014 | Brindle et al. |

(Continued)

FOREIGN PATENT DOCUMENTS

| | | | |
|---|---|---|---|
| WO | 2012087580 | A2 | 6/2012 |
| WO | 2014099406 | A1 | 6/2014 |
| WO | 2022125722 | A1 | 6/2022 |

OTHER PUBLICATIONS

Scheen, G. et al., "Post-process local porous silicon integration method for RF application," 2019 IEEE MTT-S International Microwave Symposium (IMS), Boston, MA, USA, 2019, pp. 1291-1294, doi: 10.1109/MWSYM.2019.8700844., Jun. 2-7, 2019, 4 pages.

*Primary Examiner* — Robert J Michaud
(74) *Attorney, Agent, or Firm* — Slater Matsil, LLP

(57) ABSTRACT

A three-dimensional integrated circuit includes a first integrated circuit having a first transistor and a first buried oxide layer; a second integrated circuit having a second transistor and a second buried oxide layer; a bond interface between an upper surface of the first integrated circuit and an upper surface of the second integrated circuit; a passivation layer coupled to the first buried oxide layer; and a mold wafer coupled to the second buried oxide layer.

20 Claims, 21 Drawing Sheets

(56) References Cited

U.S. PATENT DOCUMENTS

| | | | | |
|---|---|---|---|---|
| 9,064,697 | B2 | 6/2015 | Arriagada et al. | |
| 9,153,434 | B2 | 10/2015 | Brindle et al. | |
| 9,257,399 | B2 | 2/2016 | Kuang et al. | |
| 9,331,098 | B2 | 5/2016 | Stuber et al. | |
| 9,496,255 | B2 | 11/2016 | Zuo et al. | |
| 9,515,139 | B2 | 12/2016 | Arriagada et al. | |
| 9,530,796 | B2 | 12/2016 | Stuber et al. | |
| 9,558,951 | B2 | 1/2017 | Arriagada et al. | |
| 9,570,558 | B2 | 2/2017 | Brindle et al. | |
| 9,576,937 | B2 | 2/2017 | Stuber et al. | |
| 9,624,096 | B2 | 4/2017 | Stuber | |
| 9,666,566 | B1 | 5/2017 | Chen et al. | |
| 9,728,521 | B2 | 8/2017 | Tsai et al. | |
| 9,754,860 | B2 | 9/2017 | Molin et al. | |
| 9,783,414 | B2 | 10/2017 | Stuber | |
| 9,960,129 | B2 | 5/2018 | Liu et al. | |
| 10,026,716 | B2 | 7/2018 | Yu et al. | |
| 10,062,644 | B2 | 8/2018 | Howard et al. | |
| 10,510,597 | B2 | 12/2019 | Tseng et al. | |
| 10,964,691 | B2 | 3/2021 | Colinge et al. | |
| 11,164,891 | B2 | 11/2021 | Cable et al. | |
| 11,251,157 | B2 | 2/2022 | Yang et al. | |
| 2015/0221835 | A1* | 8/2015 | Tischler ................. | H10H 20/01<br>438/27 |
| 2018/0061763 | A1 | 3/2018 | Goktepeli | |
| 2018/0068886 | A1 | 3/2018 | Hammond et al. | |
| 2018/0240797 | A1 | 8/2018 | Yokoyama et al. | |
| 2022/0189888 | A1 | 6/2022 | Lai et al. | |
| 2022/0336418 | A1 | 10/2022 | Cheng | |
| 2023/0395572 | A1* | 12/2023 | Or-Bach ................ | H10D 88/01 |
| 2024/0170425 | A1* | 5/2024 | Zhang .................... | H10B 43/40 |
| 2024/0339411 | A1* | 10/2024 | Wu ......................... | H01L 25/50 |

* cited by examiner

3D-IC FOR RF APPLICATIONS

TECHNICAL FIELD

The present invention relates generally to a three-dimensional integrated circuit (3D-IC) for radio frequency (RF) applications.

BACKGROUND

Integrated circuit implementations of RF switches and RF tuners are known in the art. Chip sizes for these components can be large because of high voltage operating requirements and the use of stacked transistor architectures used in the RF switches, as well as for other reasons. The ongoing miniaturization of communication products such as cell phones requires a further shrink of the chip footprint.

SUMMARY

According to an embodiment, a three-dimensional integrated circuit comprises a first integrated circuit comprising at least a first transistor and a first buried oxide layer; a second integrated circuit comprising at least a second transistor and a second buried oxide layer; a bond interface between an upper surface of the first integrated circuit and an upper surface of the second integrated circuit; a passivation layer coupled to the first buried oxide layer; and a mold wafer coupled to the second buried oxide layer.

According to an embodiment, a three-dimensional integrated circuit comprises a first integrated circuit comprising at least a first transistor and a first buried oxide layer; a second integrated circuit comprising at least a second transistor and a second buried oxide layer; a bond interface between an upper surface of the first integrated circuit and an upper surface of the second integrated circuit; a passivation layer coupled to the first buried oxide layer; and an insulating substrate layer coupled to the second buried oxide layer, wherein the insulating substrate layer comprises aluminum nitride (AlN), aluminum oxide ($Al_2O_3$), or glass.

According to an embodiment, a method for fabricating a three-dimensional integrated circuit comprises fabricating a first silicon wafer having a plurality of first integrated circuits; fabricating a second silicon wafer having a plurality of second integrated circuits; polishing an upper surface of the first silicon wafer; polishing an upper surface of the second silicon wafer; bonding the upper surface of the first silicon wafer to the upper surface of the second silicon wafer; removing a portion of the first silicon wafer to expose a first buried oxide layer; attaching an intermediate handling wafer to the first silicon wafer; removing a portion of the second silicon wafer to expose a second buried oxide layer; and attaching a mold wafer to the second silicon wafer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
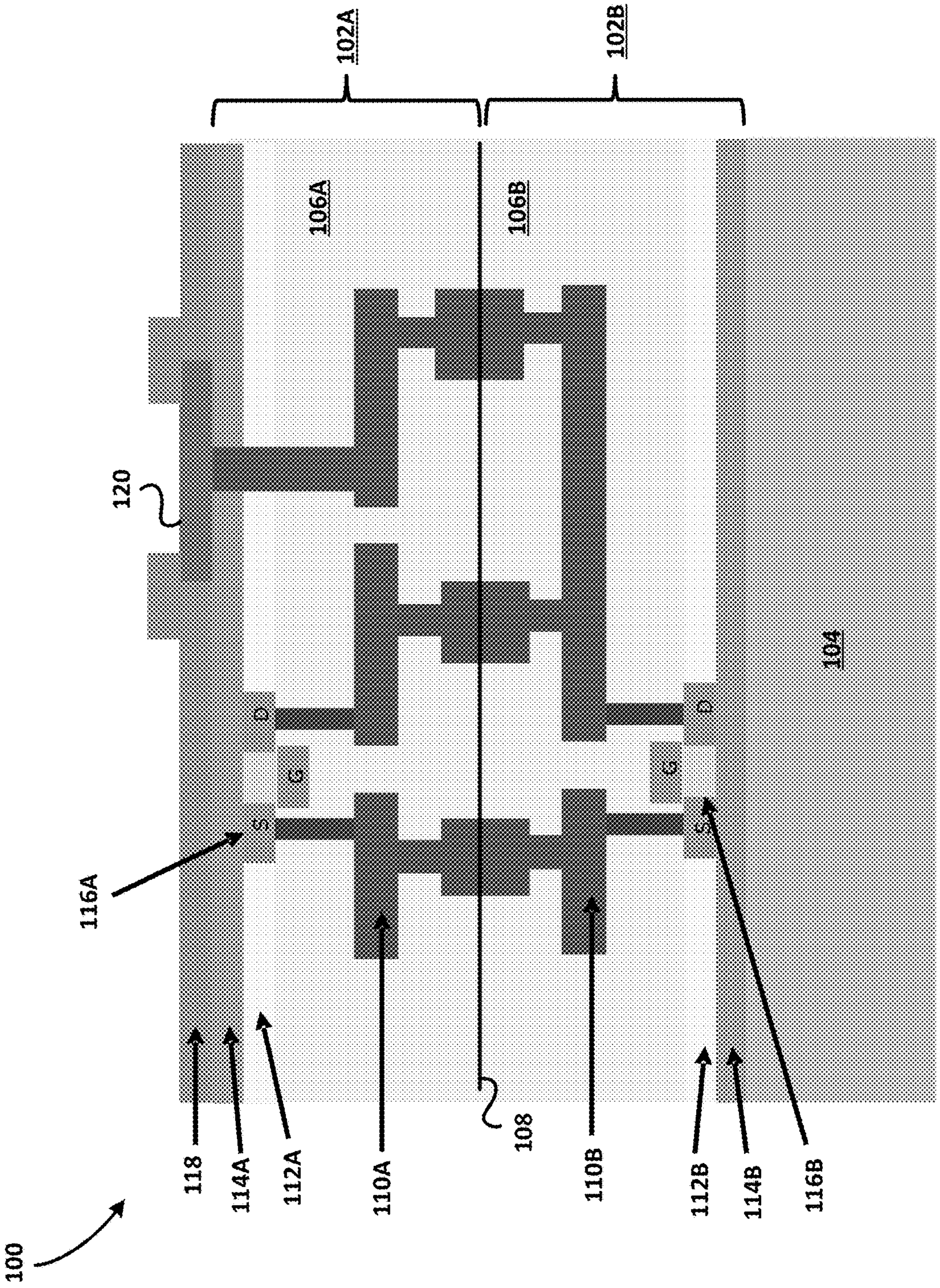
FIG. 1 is a cross-sectional view of a 3D-IC for use in RF applications, according to a first embodiment.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

According to embodiments, the 3D-IC advantageously attains a reduced integrated size or "footprint" (chip size reduction) of RF-switch integrated circuits and/or RF-Tuner integrated circuits. According to embodiments, the RF-switch circuit and/or RF-tuner circuit is distributed on two chips (chip 1 and chip 2) having the same size (area). Chip 1 and chip 2 are bonded together so that the resulting 3D-IC has about half the size (area) of a conventional chip including the same circuitry. According to embodiments, the 3D-IC advantageously has a smaller area, improved RF performance, better heat management and reduced manufacturing and final chip costs when compared to conventional RF integrated circuits. Additional cost savings are realized due to the use of a "mold wafer." In some embodiments, the mold wafer comprises a substrate for one of the two chips, wherein the mold wafer is formed from a mold compound. The use of a mold wafer obviates the need for expensive substrates or carriers such as a radio-frequency silicon-on-insulator (RF-SOI) wafer or a trap-rich-high-resistivity (TR-HR) wafer. Additional performance improvements and cost savings (such as no wafer contact on chip 2) are described below.

According to embodiments, the reduction in chip size for the RF-switch and/or RF-tuner integrated circuit is attained by dividing the RF-switch and/or RF-tuner circuit into two circuit portions. Each circuit portion is realized on a separate chip (chip 1 and chip 2). In an embodiment, chip 1 may contain circuit portions of the RF-switch and the RF-tuner, wherein chip 2 may contain other circuit portions of the RF-switch and the RF-tuner. The boundary between the two circuit portions may be made at circuit nodes that are less sensitive to additional parasitic capacitance and parasitic inductance. The two chips (chip 1 and chip 2) are bonded together by a hybrid bonding process. The hybrid process provides an electrical and mechanical contact between the two chips to form the 3D-IC, which is described in further detail below.

FIG. 1 is a cross-sectional view of a first 3D-IC 100 for use in RF applications, according to a first embodiment. First 3D-IC 100 comprises a first chip (chip 1) 102A in an upper position, and a second chip (chip 2) 102B in a lower position. A mold wafer 104 is attached to a bottom surface of chip 2 102B. Chip 1 102A includes a first dielectric layer 106A, and chip 2 102B includes a second dielectric layer 106B. Chip 1 102A and chip 2 102B are joined together at the exposed surfaces of the first dielectric layer 106A and the second dielectric layer 106B through bond interface 108. Chip 1 102A includes a metal wiring layer 110A that includes a horizontal metal layer as well as a plurality of vertical metal vias. In some embodiments, chip 1 102A can also include one or more additional metal wiring layers. Chip 2 102A includes a metal wiring layer 110B that includes a horizontal metal layer as well as a plurality of metal vias. In some embodiments, chip 2 102B can also include one or more additional metal wiring layers. Chip 1 102A includes a shallow trench isolation (STI) layer 112A for isolating a plurality of transistor such as RF-transistor 116A. Chip 2 102B also includes a similar shallow trench isolation (STI) layer 112B for isolating a plurality of transistors such as RF-transistor 116B. Chip 1 102A further includes a first buried oxide (BOX) layer 114A, and chip 2 102B further includes a similar buried layer, second buried oxide (BOX) layer 114B. In an embodiment, chip 1 102A is passivated with passivation layer 118, and can include one or more metal bonding pads, such as pad 120.

The silicon handling wafer of chip 1 102A (not shown in FIG. 1 and described in greater detail below) is finally removed down to the first buried oxide (BOX) layer 114A. In some embodiments, the silicon handling wafer of chip 2 is typically not removed. To ensure RF performance an expensive trap-rich-high-resistivity wafer (TR-HR-Wafer) can be used for chip 2.

The performance of the first 3D-IC 100 can be increased by removing the silicon handling wafer below chip 2 102 and bonding chip 2 102B to the mold wafer 104. The improvement of RF-performance by using a mold wafer is described in U.S. Pat. No. 11,605,572 entitled "Electronic component with semiconductor die having a low ohmic portion with an active area and a high ohmic portion on a dielectric layer," which is hereby incorporated by reference. Other materials such aluminum nitride AlN, aluminum oxide $Al_2O_3$, or glass ($SiO_2$) can also be used instead of the mold wafer 104. Advantageously RF performance can be increased but a cost reduction is also realized, because a more cost effective SOI-wafer can be used instead of the expensive TR-HR-Wafer in some embodiments. In some embodiments process steps to provide a substrate contact can also be skipped for further cost reductions.

An example manufacturing flow for the first 3D-IC 100 is described below with respect to sequential processing steps shown in cross-sectional views in drawing FIGS. 2-9.

Figure 2:
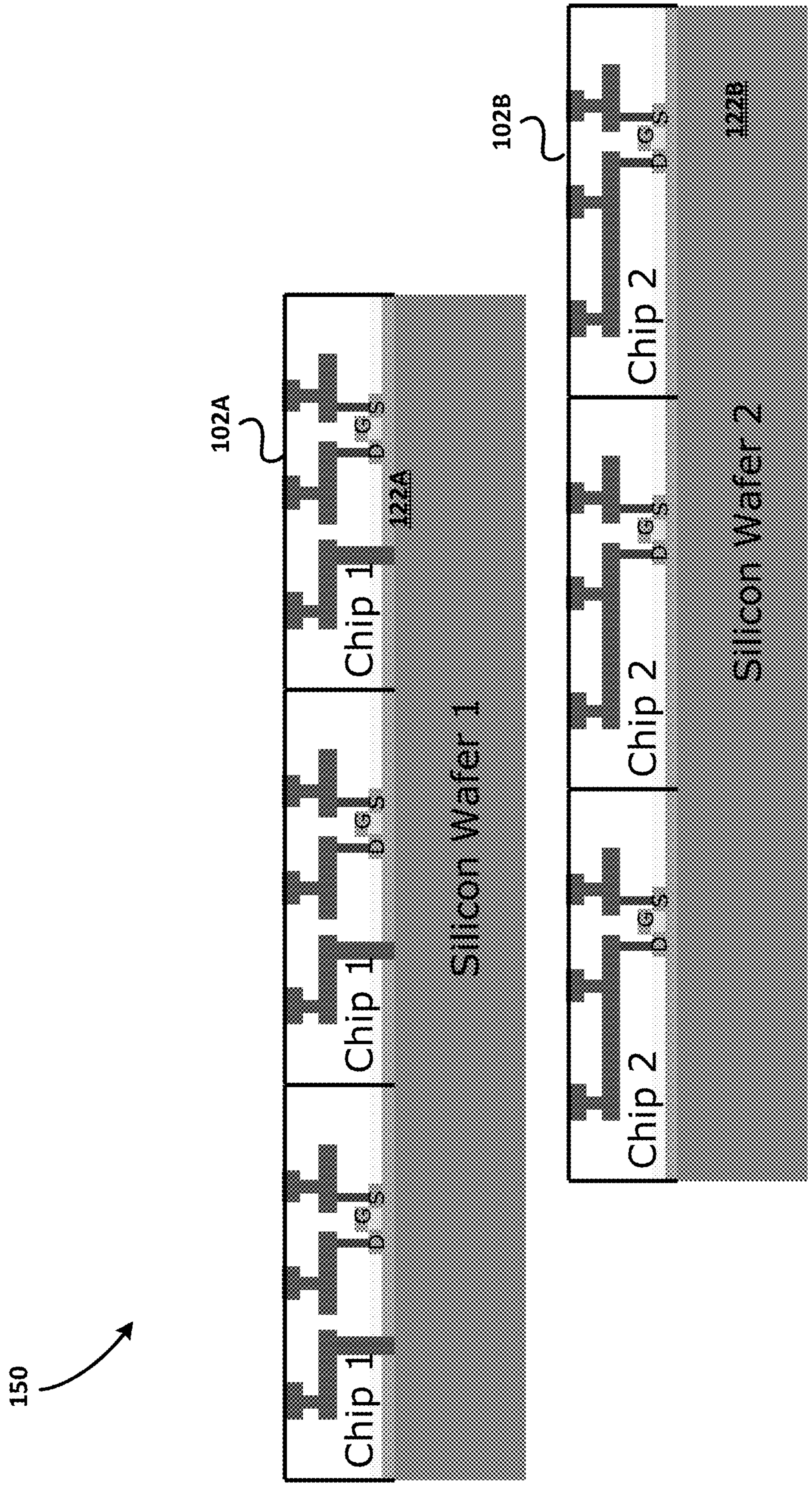
FIGS. 2-9 are cross-sectional views of the 3D-IC of FIG. 1 illustrating sequential process steps of an example manufacturing process.

FIG. 2 illustrates a first processing step 150, wherein a plurality of first chips chip 1 102A and a plurality of second chips chip 2 102B are manufactured on corresponding different SOI doped silicon handing wafers. These SOI doped silicon handling wafers are substantially less expensive than specialty RF handling wafers. Silicon wafer 1 122A includes a plurality of identical chips of chip 1 102A. As previously described, chip 1 102A comprises circuitry portions of an RF-switch and/or an RF-tuner. Silicon wafer 2 122B includes a plurality of identical chips of chip 2 102B. As previously described, chip 2 102B comprises different circuitry portions of an RF-switch and/or an RF-tuner, such that the combination of chip 1 102A and chip 2 102B encompass all of the circuit components of the RF-switch and/or RF-tuner.

Figure 3:
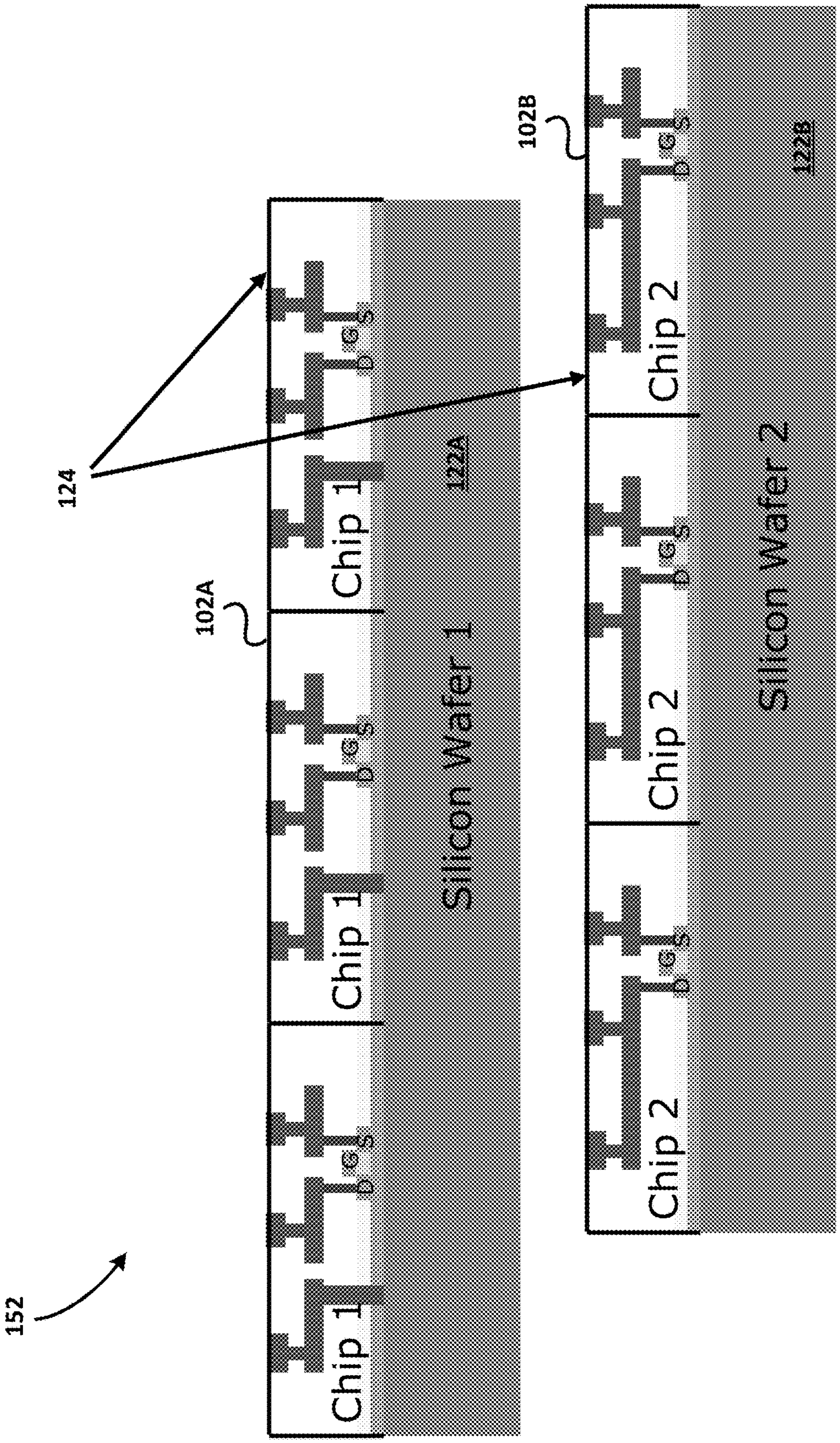

FIG. 3 illustrates a second processing step 152, wherein silicon wafer 1 122A and silicon wafer 2 122B are prepared for wafer bonding. In particular, the top surface 124 of the plurality of chips (chip 1 102A and chip 2 102B) are polishing to achieve smooth top surfaces.

Figure 4:
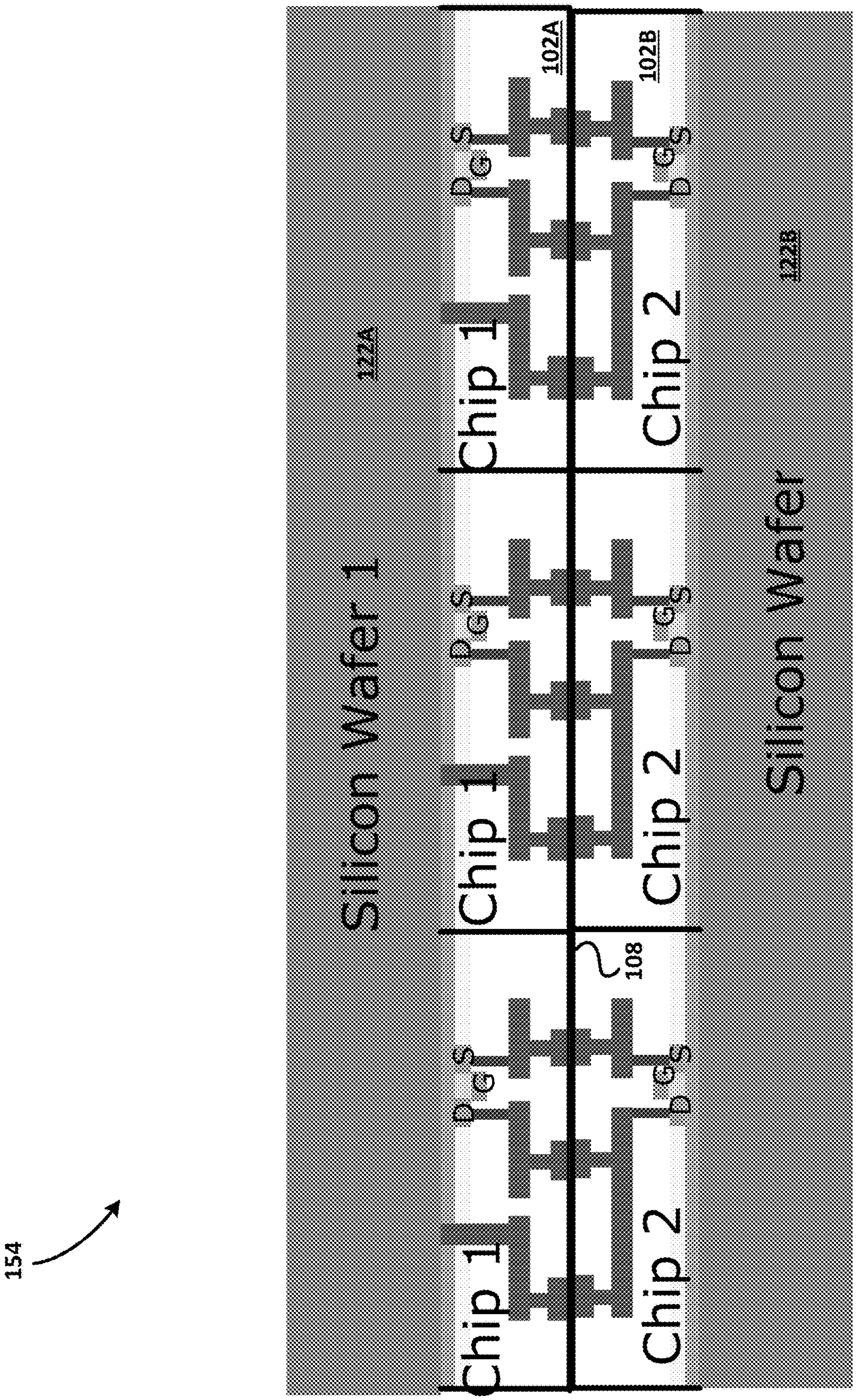

FIG. 4 illustrates a third processing step 154, wherein silicon wafer 1 122A and silicon wafer 2 122B are bonded together. In an embodiment, silicon wafer 1 122A is vertically flipped and precisely aligned to silicon wafer 2 122B, such that all corresponding metal contact points are properly arranged. In third processing step 154, plasma activation is used to prepare the polished surfaces of silicon wafer 1 122A and silicon wafer 2 122B for bonding. Bonding at bond interface 108 is accomplished using a hybrid bonding tool.

Figure 5:
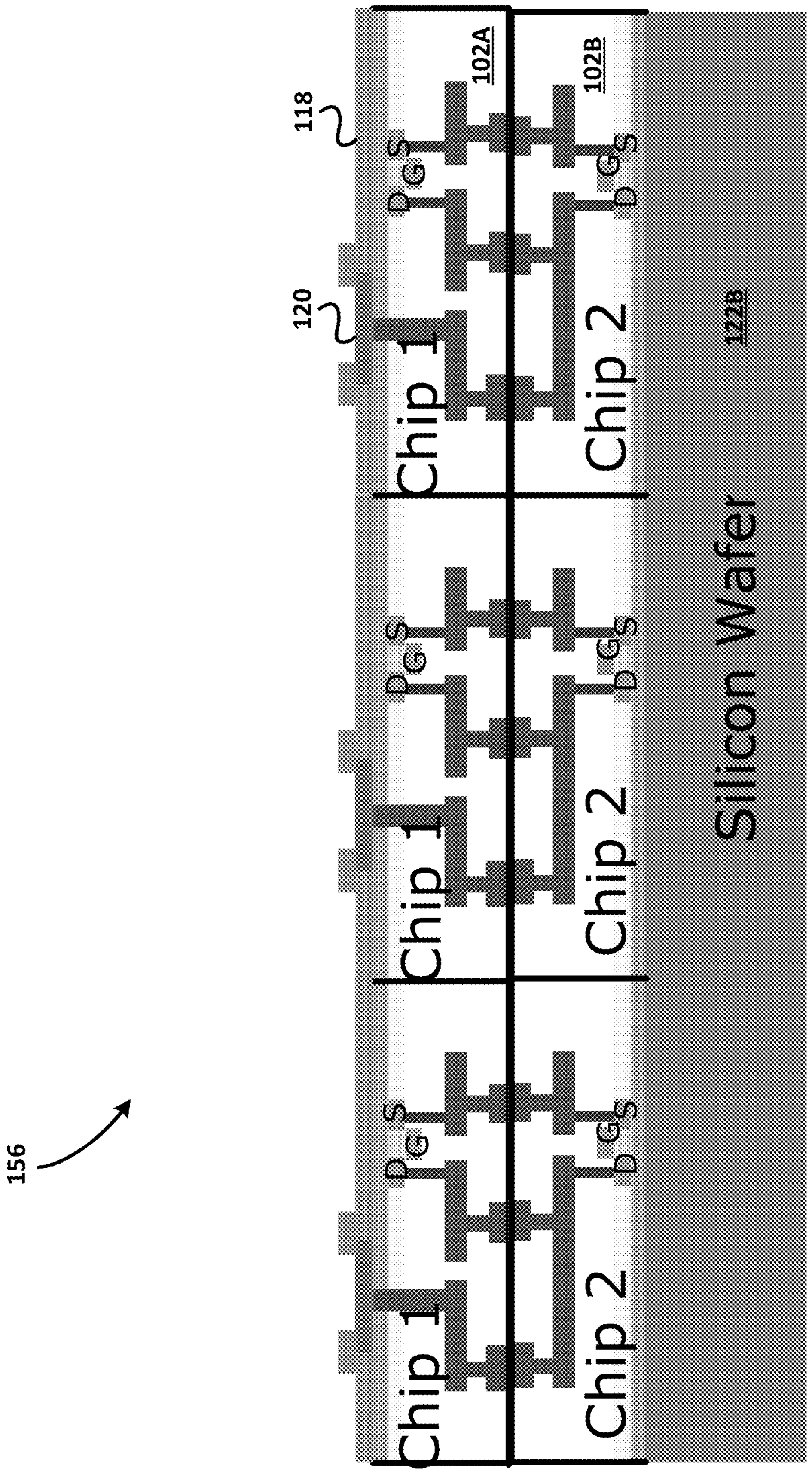

FIG. 5 illustrates a fourth processing step 156, wherein silicon wafer 1 122A is removed by grinding and/or etching down to the first BOX layer 114A. Once silicon wafer 1 122A has been removed, depositing and structuring of pad-metallization for pad 120 is performed. Once one or more pads are formed, depositing and structuring of passivation layer 118 is performed.

Figure 6:
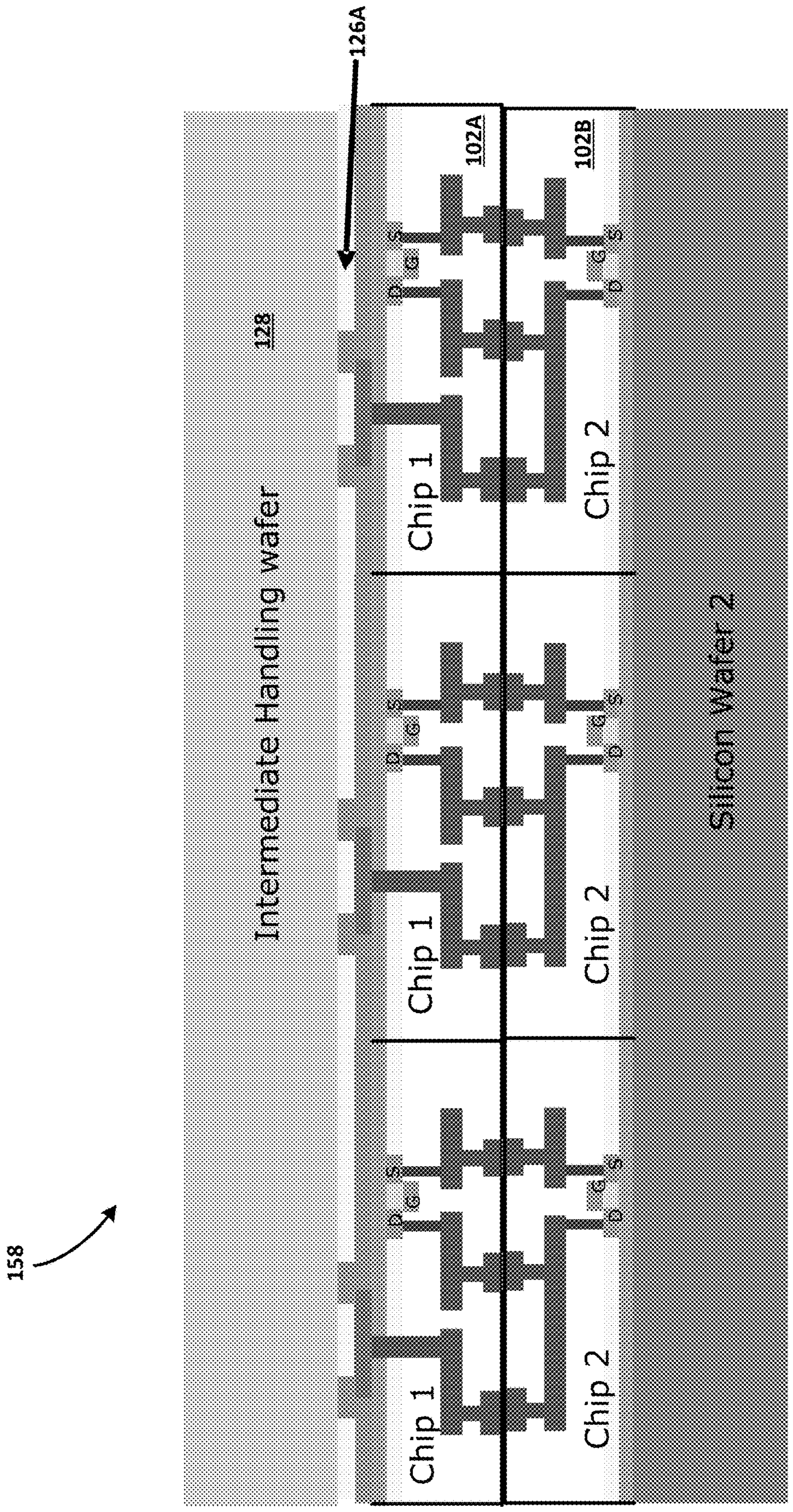

FIG. 6 illustrates a fifth processing step, wherein an intermediate handling wafer 128 (e.g. a glass wafer) is mounted on the top side of the plurality of chips (chip 1 102A) using an adhesive tape or glue layer 126A.

Figure 7:
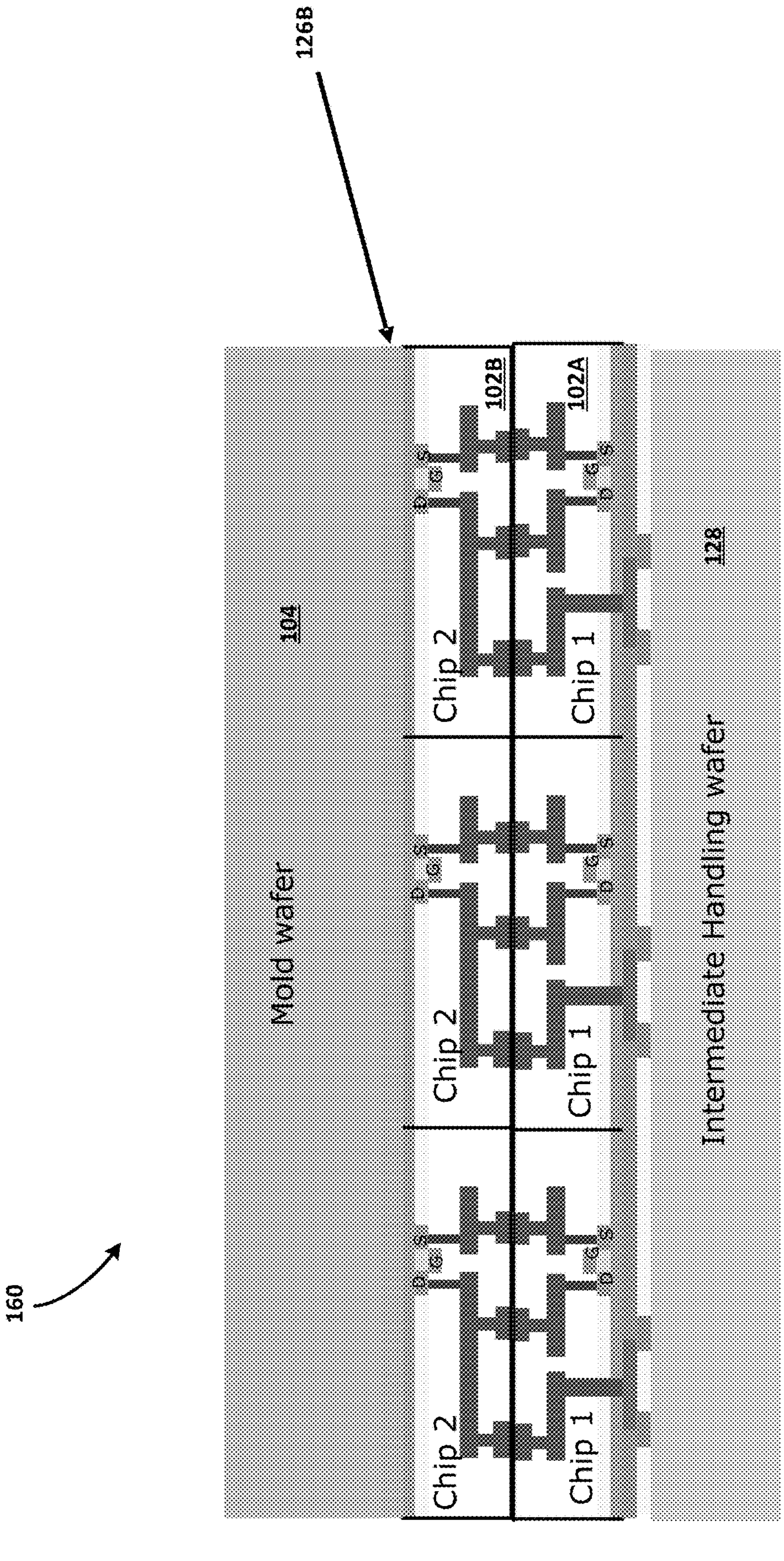

FIG. 7 illustrates a sixth processing step 160, wherein the plurality of mounted wafers are flipped, and silicon wafer 2 122B is removed. The removal can be implemented, for example, by grinding and/or etching down to second BOX layer 114B. A new handling wafer is mounted on the new top side of the mounted wafers (top surface of flipped chip 2 102B). In some embodiments, the new handling wafer can comprise a mold wafer 104 or a wafer comprising aluminum nitride (AlN), Aluminum oxide ($Al_2O_3$), or glass ($SiO_2$). The new handling wafer can be mounted by using a glue layer 126B or an adhesive tape.

Figure 8:
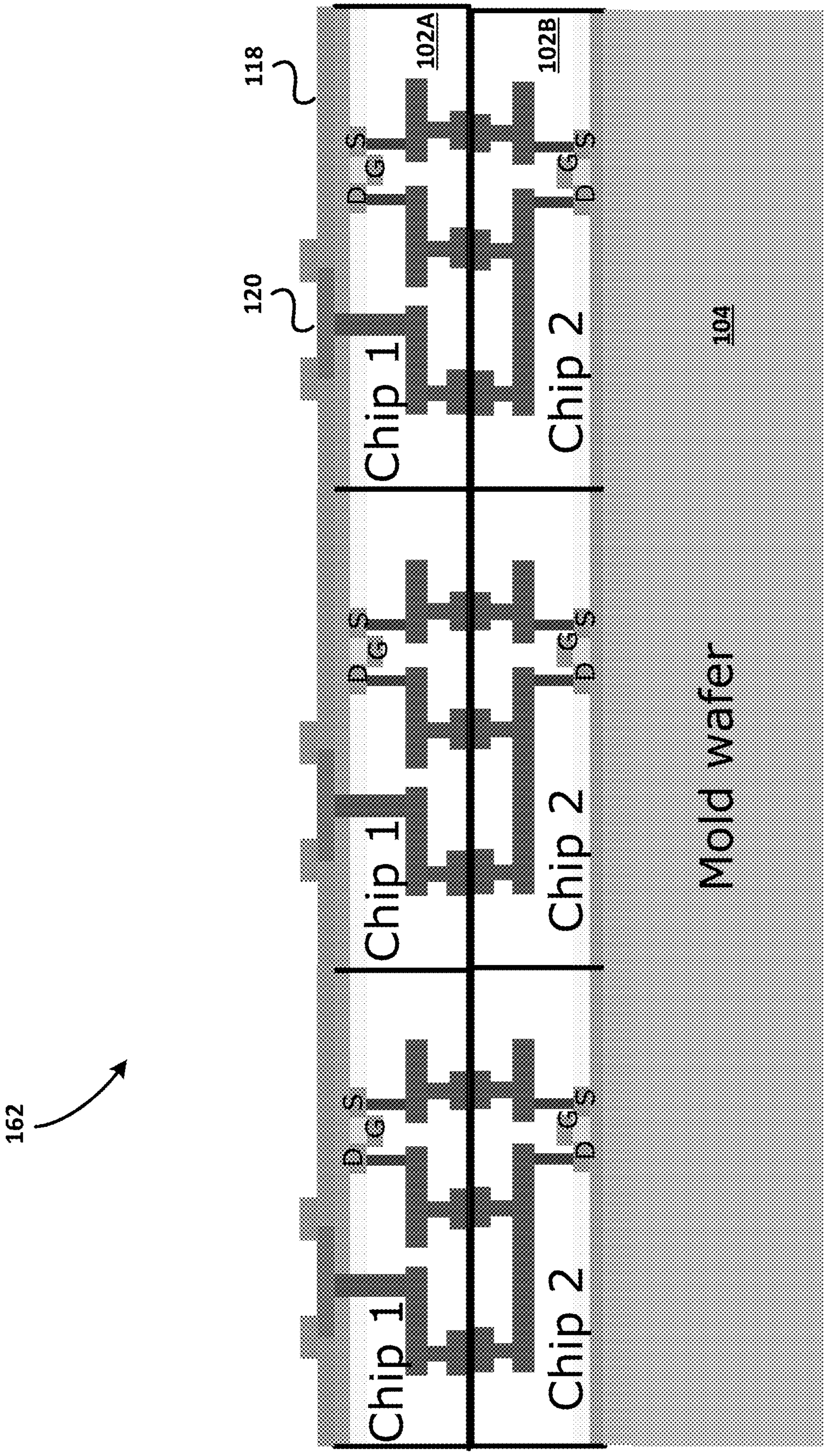

FIG. 8 illustrates a seventh processing step 162, wherein the mounted wafers are flipped again to the original orientation, and the intermediate handling wafer 128 is removed. Once the intermediate handling wafer 128 is removed, the top surface of the plurality of chips (chip 1 102A) is cleaned.

Figure 9:
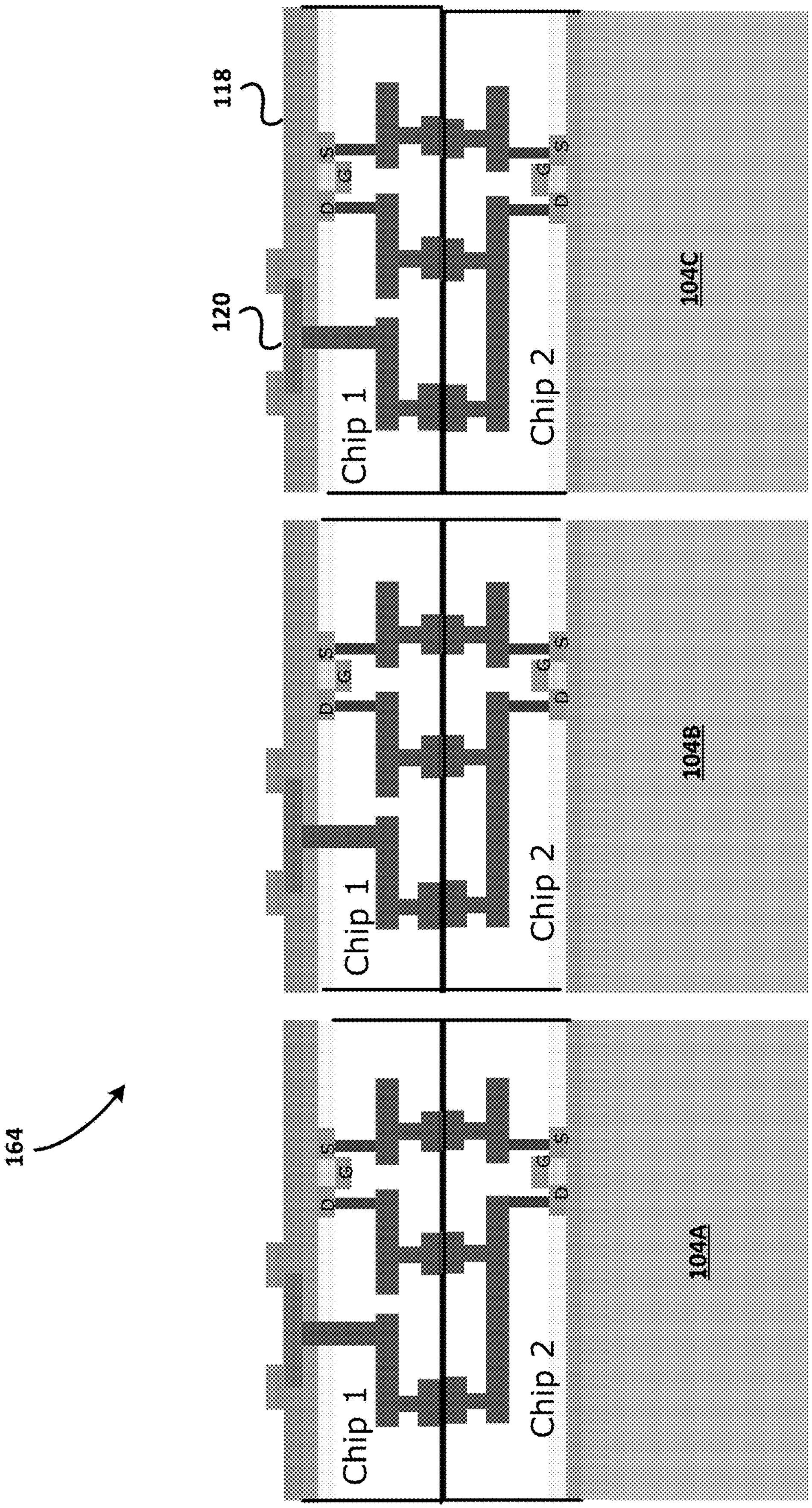

FIG. 9 illustrates an eighth processing step 164, wherein singularization of the individual bonded chips (chip 1 102A and chip 2) and corresponding portions of the mold wafer (104A, 104B, and 104C) is performed. Singularization can be performed, for example, by sawing, laser cutting, or etching.

The individual 3D-ICs can then be packaged into individual packages or fabricated in a hybrid circuit along with other supporting components (not shown).

Figure 10:
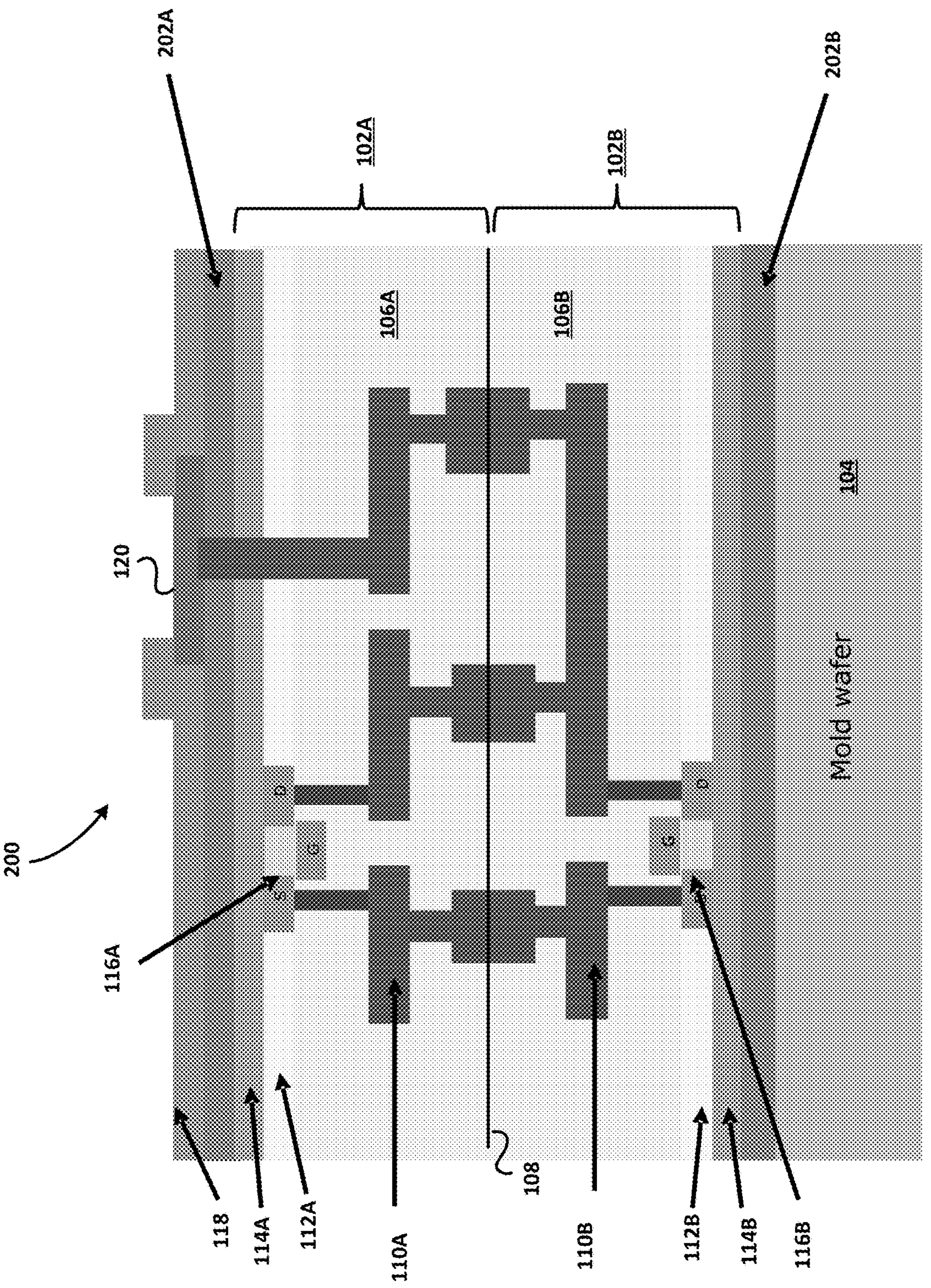
FIG. 10 is a cross-sectional view of a 3D-IC for use in RF applications, according to a second embodiment.

FIG. 10 is a cross-sectional view of a second 3D-IC 200 for use in RF applications, according to a second embodiment. To improve the heat management of the second 3D-IC 200 an additional heat-spreading layer can be introduced between the active layer of chip 2 102B and the mold wafer 104 (second heat spreading layer 202B, which can also be referred to as a "second heat spreader layer") and/or the active layer of chip 1 102A and the passivation layer 118 (first heat spreading layer 202A, which can also be referred to as a "first heat spreader layer"). For example, a diamond-like-coating can be used as material for the first heat spreading layer 202A or the second heat spreading layer 202B. A layer of aluminum nitride (AlN) or aluminum oxide ($Al_2O_3$) in some embodiments.

Figure 11:
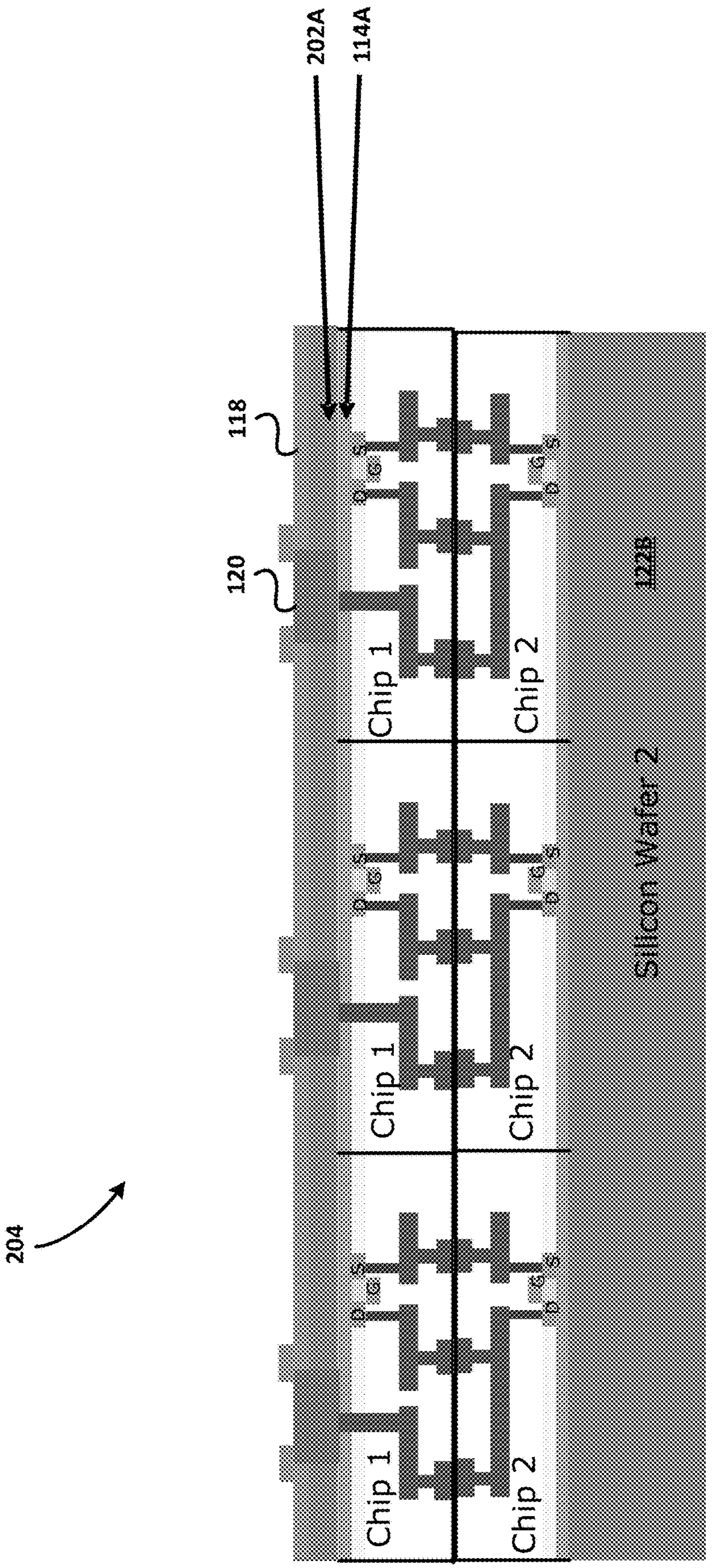
FIGS. 11-12 are cross-sectional views of the 3D-IC of FIG. 10 illustrating process steps of an example manufacturing process.
Figure 12:
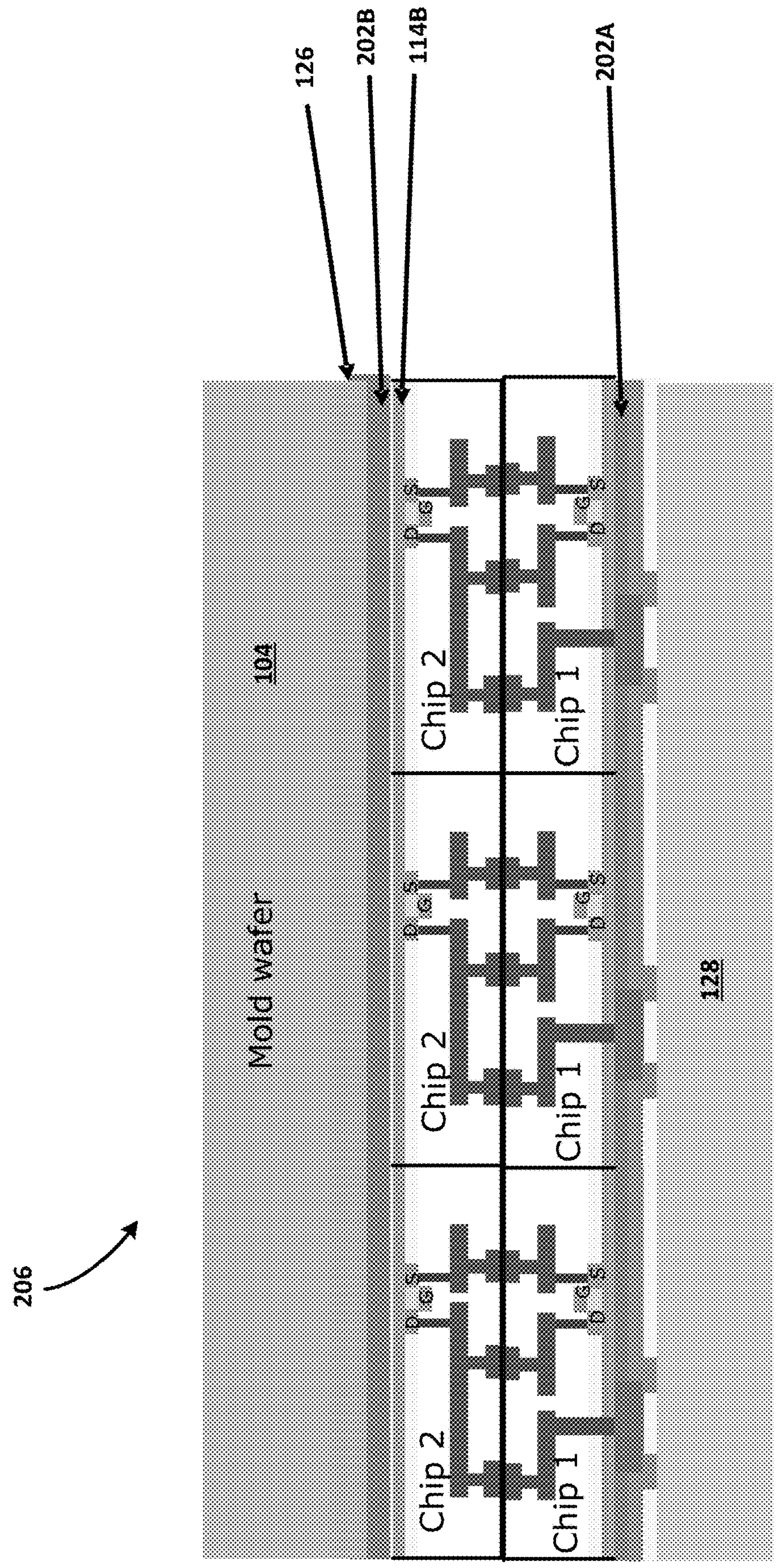

FIGS. 11-12 are cross-sectional views of the second 3D-IC 200 of FIG. 10 illustrating process steps of an example manufacturing process. In particular, FIGS. 11-12 show particular details with respect to the first heat spreading layer 202A and the second heat spreading layer 202B, whereas all of the other process steps from the first example manufacturing process remain substantially the same. In the intermediate step 204 of FIG. 11, the handling wafer 1 (not shown) is removed by grinding and/or etching down to the first BOX layer 114A. The first heat spreading layer 202A is then deposited and structured using the AlN, $Al_2O_3$, or diamond-like coating (DLC) materials previously described. Once the first heat spreading layer 202A is deposited, the pad-metallization for pad 120 is deposited and structured. Once the metallization for pad 120 is deposited, the passivation layer 118 is deposited and structured. In the intermediate step 206 of FIG. 12, the mounted wafers are flipped and silicon wafer 2 (not shown) is removed, for example, by grinding and/or etching down to the second BOX layer 114B. The second heat spreading layer 202B is then deposited using the AlN, $Al_2O_3$, or diamond-like coating materials previously described. The glue layer 126 is then deposited and the mold layer 104 is then attached according to an embodiment as previously described.

Figure 13:
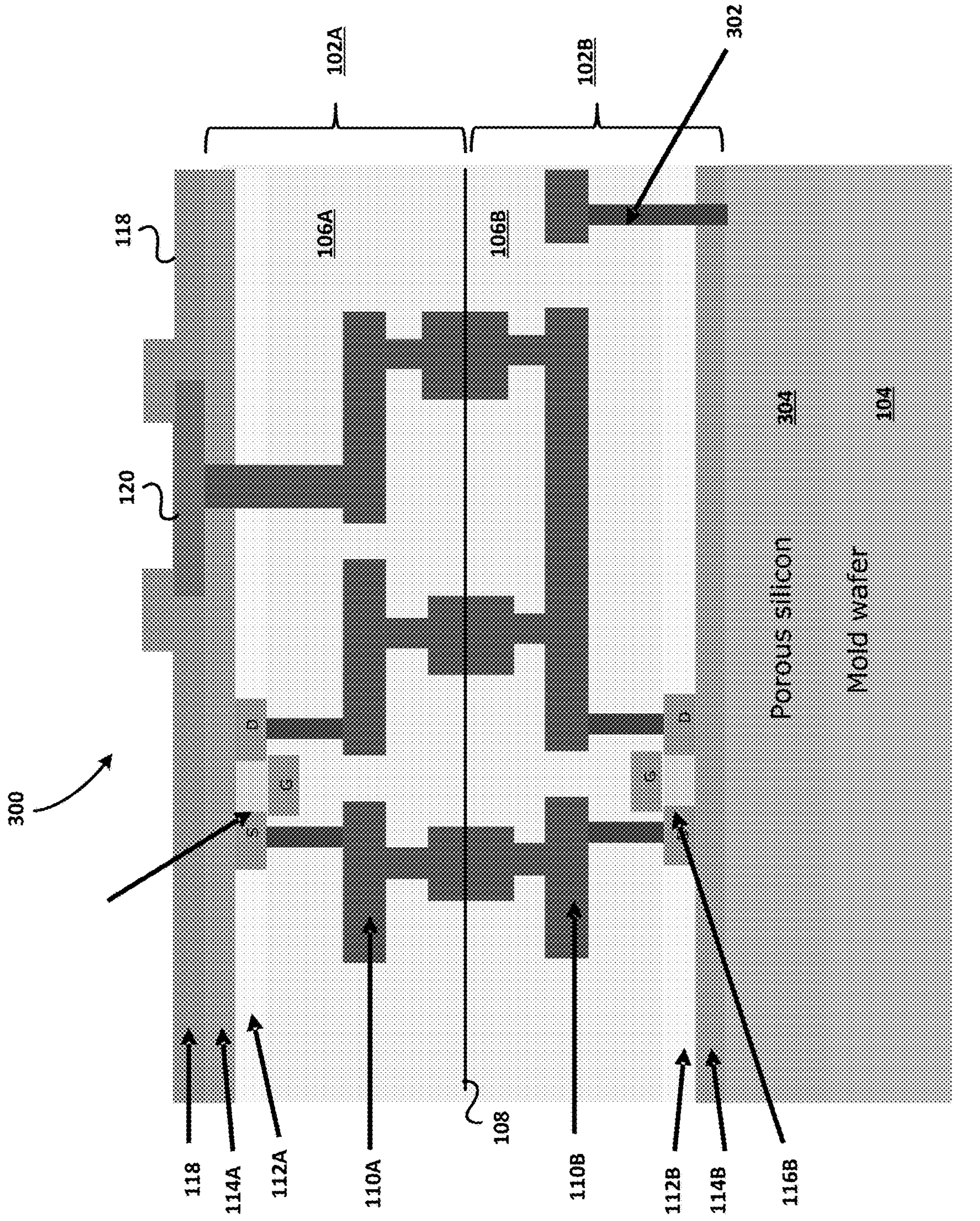
FIG. 13 is a cross-sectional view of a 3D-IC for use in RF applications, according to a third embodiment.

FIG. 13 is a cross-sectional view of a third 3D-IC 300 for use in RF applications, according to a third embodiment. In the third embodiment, a thin layer portion of the handling wafer of chip 2 remains (porous silicon layer 304) after a portion of the handling wafer has been removed. To ensure RF-performance the remaining silicon is etched by known prior art treatments to create the porous silicon layer 304. The porous silicon layer 304 is thus located between the second BOX layer 114B and the mold wafer 104, in this embodiment.

Figure 14:
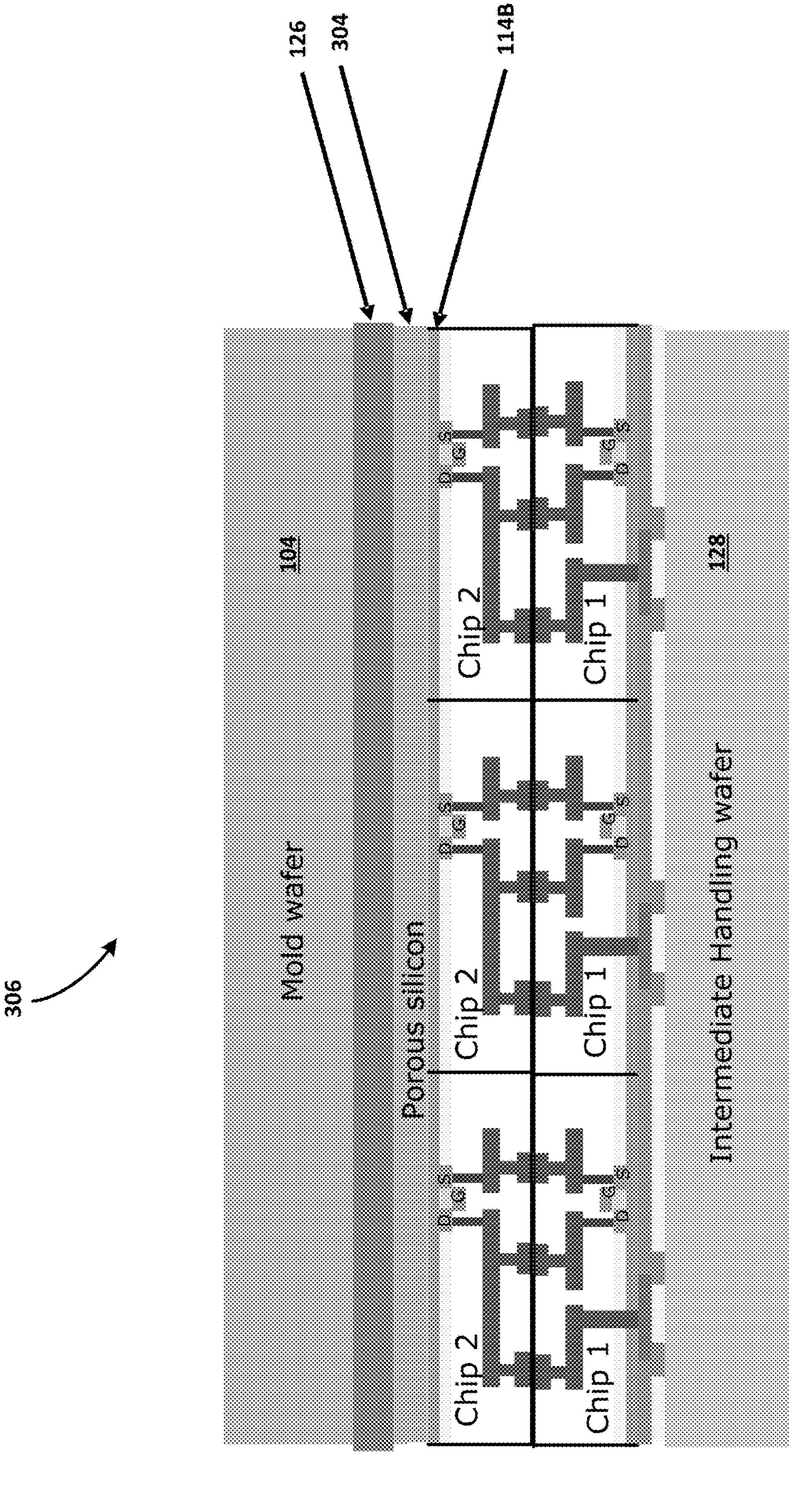
FIG. 14 is a cross-sectional view of the 3D-IC of FIG. 13 illustrating a process step of an example manufacturing process.

FIG. 14 is a cross-sectional view of the third 3D-IC 300 of FIG. 13 illustrating a process step of an example manufacturing process. The example manufacturing process is substantially similar to the example manufacturing process of the first 3D-IC 100, except that the grinding process does not proceed completely down to second BOX layer 114B. In the intermediate step of FIG. 14 the mounted wafers are shown in the flipped configuration, and silicon wafer 2 has been only partially removed (to provide porous silicon layer 304 as is explained below). The remaining silicon layer of silicon wafer 2 is etched according to a porous etching step to generate porous silicon layer 304. The porous silicon layer 304 is thus located between the second BOX layer 114B and the mold wafer 104, in this embodiment, as previously described.

Figure 15:
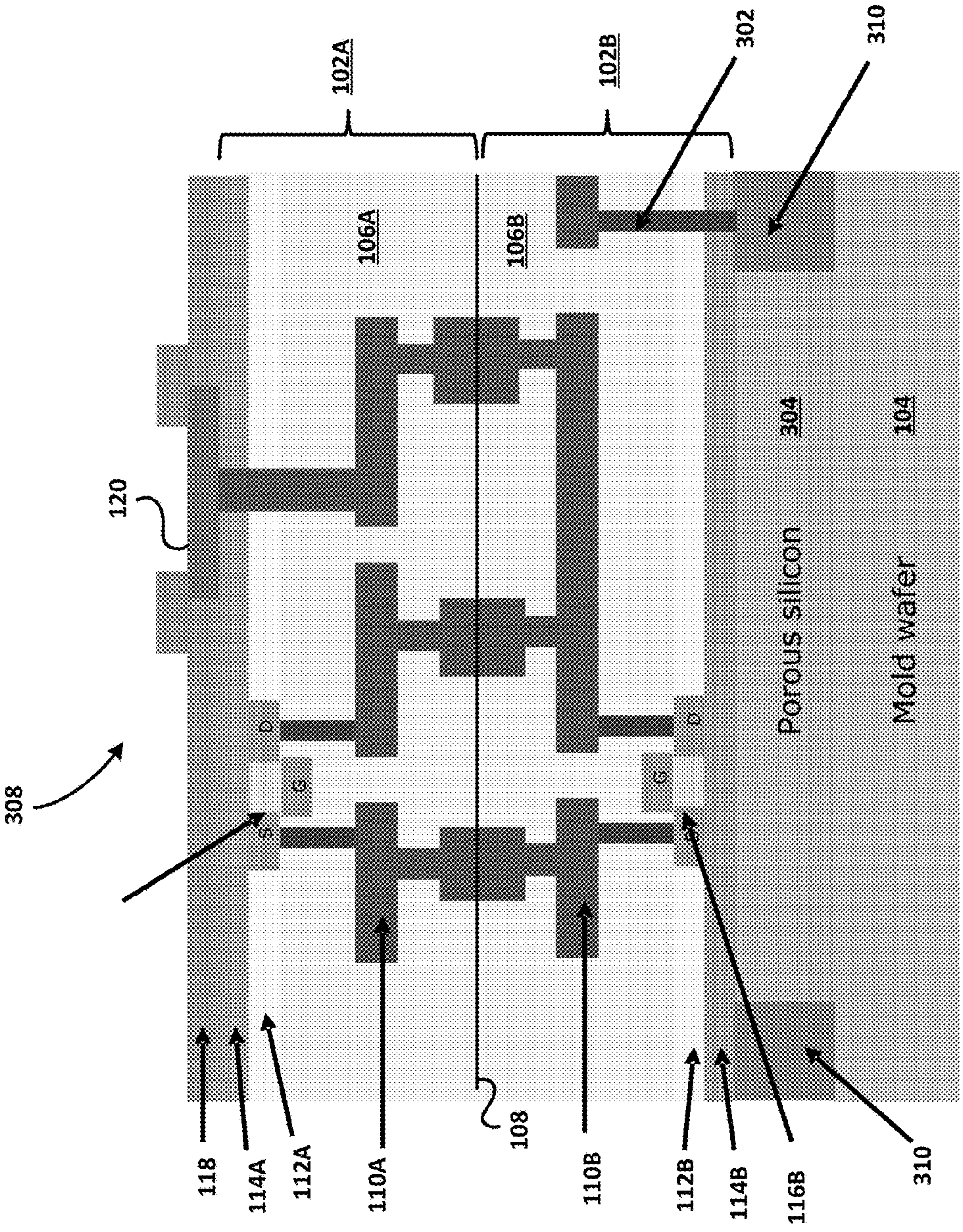
FIG. 15 is a cross-sectional view of a 3D-IC for use in RF applications, according to an alternative third embodiment.

FIG. 15 is a cross-sectional view of an alternative third 3D-IC 308 for use in RF applications, according to an alternative third embodiment. In this embodiment, the etching treatment to create a porous layer can be performed only on a portion of the remaining silicon handling layer to create a porous silicon layer 304 located between crystalline silicon layer 310 portions. The portion of the remaining silicon layer can be selected etched with the porous silicon treatment only on the portion of the silicon layer located below RF-transistor 116B, (porous silicon layer 304). The silicon below any remaining circuitry such as logic circuits can remain as crystalline silicon to improve the mechanical stability.

Figure 16:
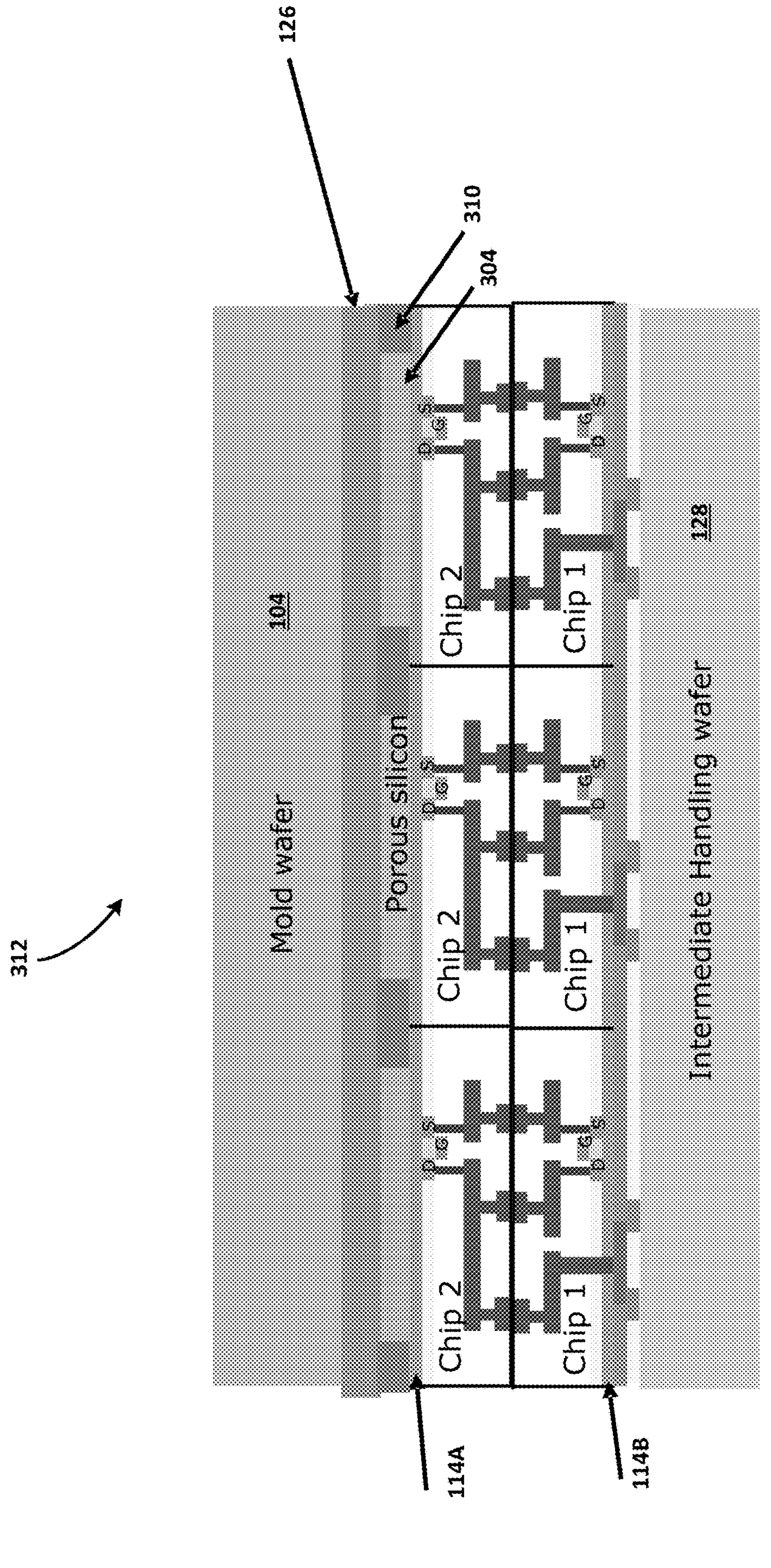
FIG. 16 is a cross-sectional view of the 3D-IC of FIG. 15 illustrating a process step of an example manufacturing process.

FIG. 16 is a cross-sectional view of the 3D-IC 308 illustrating an intermediate step 312 of an example manufacturing process, wherein the intermediate handling wafer 128 is also shown. The example manufacturing process is substantially similar to the example manufacturing process of the first 3D-IC 100, except that the grinding process does not proceed completely down to second BOX layer 114B. In the alternative third embodiment, the remaining silicon wafer is covered with a protection layer (not shown in FIG. 16). The protection layer is then structured to provide an etching mask. The porous silicon etching step is then selectively applied to generate porous silicon layer 304 portions from the remaining silicon wafer. Note that the porous silicon layer 304 portions are situated between the crystalline silicon layer 310 portions. The protection layer (mask) is then removed, and the glue layer 126 is deposited and the mold wafer 104 is attached.

Figure 17:
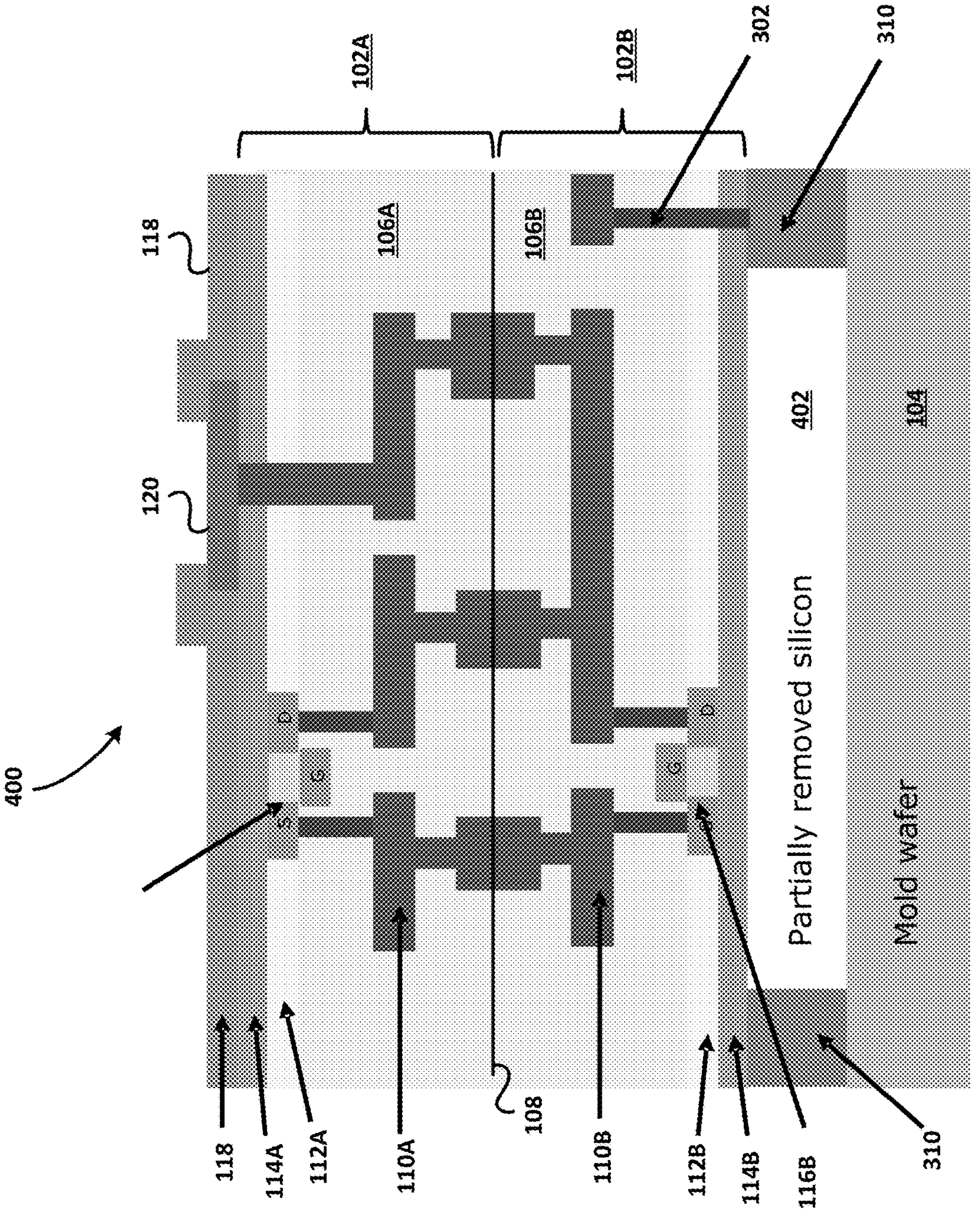
FIG. 17 is a cross-sectional view of a 3D-IC for use in RF applications, according to a fourth embodiment.

FIG. 17 is a cross-sectional view of a fourth 3D-IC 400 for use in RF applications, according to a fourth embodiment. In the fourth embodiment, the handling wafer is completely removed under the RF portions of chip 2 102B. As a result a cavity 402 remains under the RF portions of chip 2. In some embodiments, cavity 402 can be filled by another material, for example a mold compounds. The cavity 402 is bounded on both sides by crystalline silicon layer 310 portions. The thickness of these crystalline silicon layer 310 portions can be the same as the thickness of the original handling wafer, but in some embodiments can be thinned by grinding. The mold wafer 104 is then attached to the crystalline silicon layer 310 portions as shown in FIG. 17.

Figure 18:
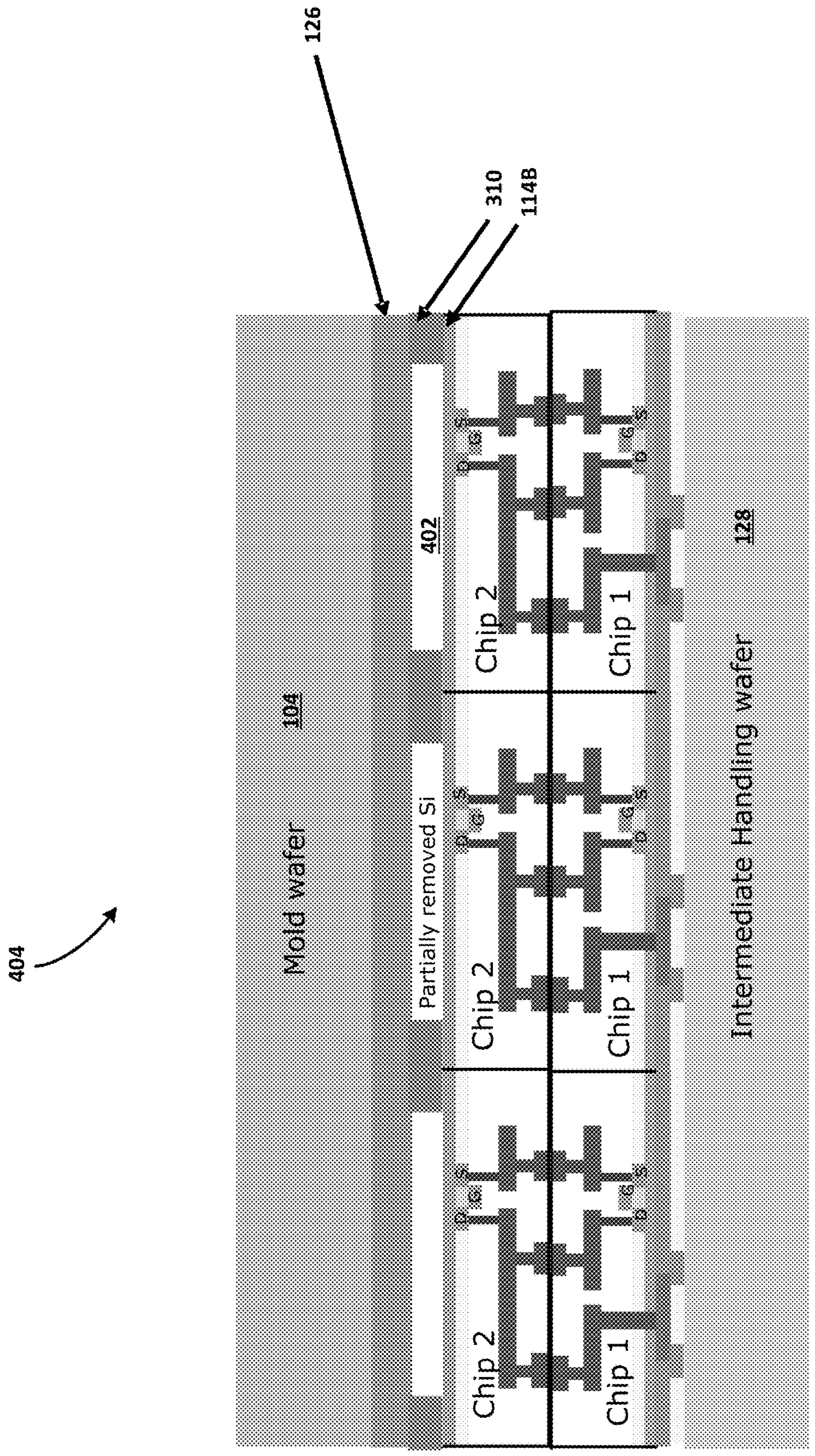
FIG. 18 is a cross-sectional view of the 3D-IC of FIG. 17 illustrating a process step of an example manufacturing process.

FIG. 18 is a cross-sectional view of the 3D-IC 400 illustrating an intermediate step 404 of an example manufacturing process, wherein the intermediate handling wafer 128 is also shown. In FIG. 18, the handling wafer is partially removed by grinding and/or etching to reduce the thickness thereof. Then the reduced thickness silicon layer is structured using photolithography and subsequently selectively etched down to second BOX layer 114B. Cavity 402 or a plurality of cavities and crystalline silicon layer 310 portions are formed by the selective etching process. The mold wafer 104 is attached to the crystalline silicon layer 310 portions.

Figure 19:
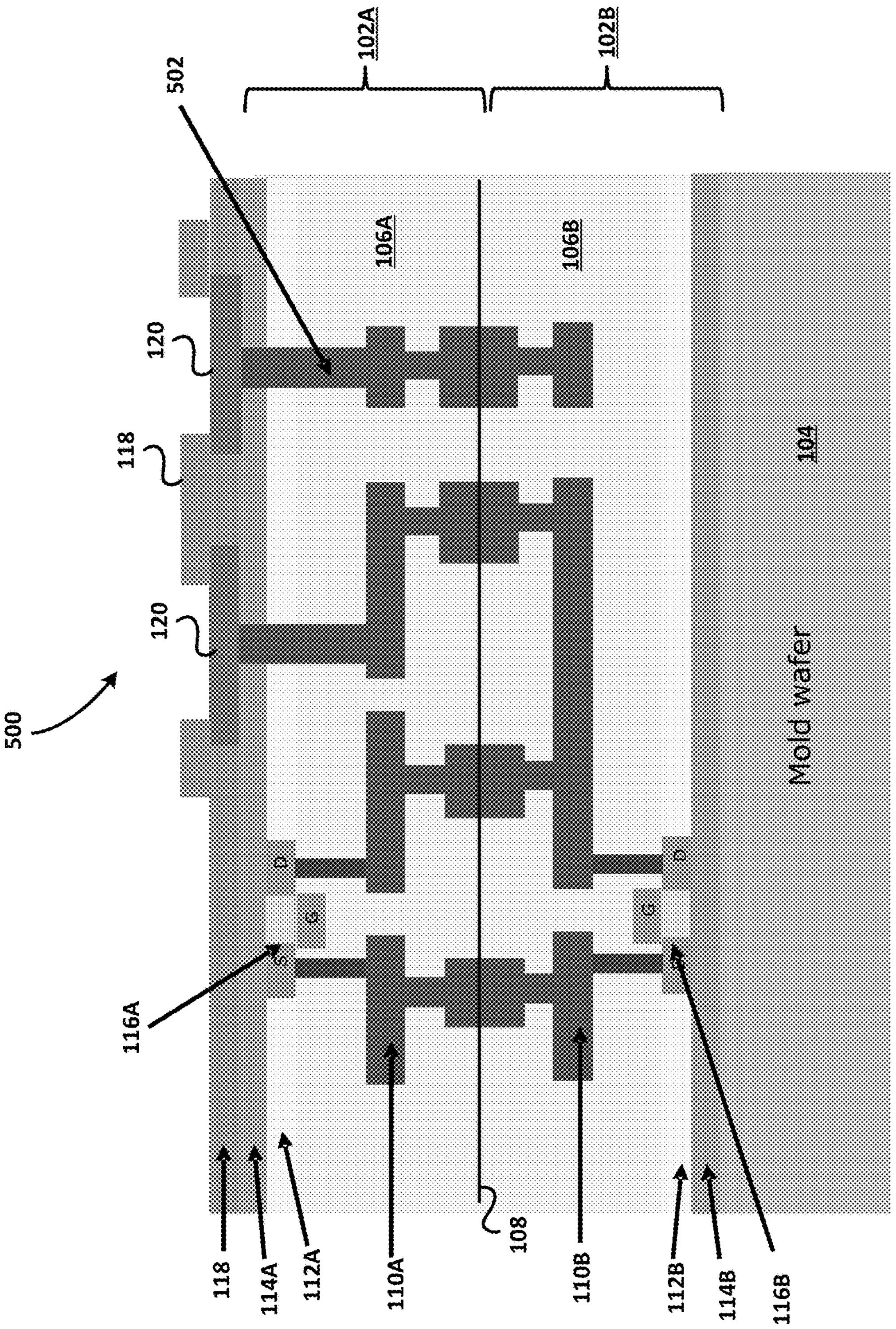
FIG. 19 is a cross-sectional view of a 3D-IC for use in RF applications, according to a fifth embodiment.

FIG. 19 is a cross-sectional view of a fifth 3D-IC 500 for use in RF applications, according to a fifth embodiment, which includes a heat-pipe 502 not shown in previous embodiments. Heat-pipe 502 comprises a first plurality of metallization parts in chip 1 102A, and a second plurality of metallization parts in chip 2 102B. The first and second plurality of metallization parts are coupled together at bond interface 108. Heat-pipe 502 is thus formed as a complete single entity. A pad 120 coupled to heat-pipe 503 is connected by a bond wire or a solder bump to a board or package, which in turn is connected to a heat sink (not shown in FIG. 19) in an embodiment. The metallization of heat-pipe 503 has no electrical function, and is therefore not coupled to any components within chip 1 102A or within chip 2 102B. The only purpose of heat-pipe 503 is to provide a heat sink and a reduction of the temperature inside of the fifth 3D-IC 500.

Figure 20:
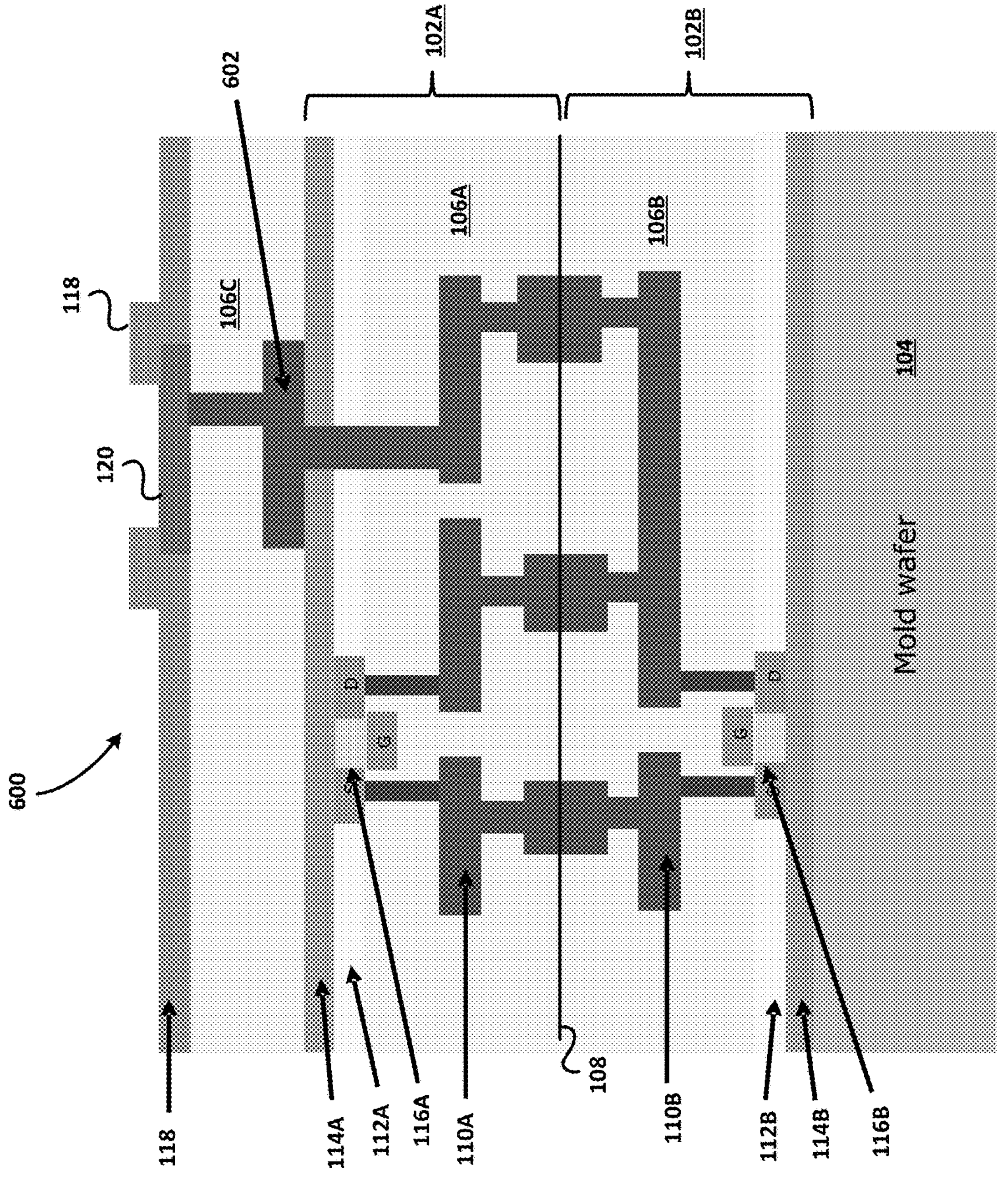
FIG. 20 is a cross-sectional view of a 3D-IC for use in RF applications, according to a sixth embodiment.
Figure 21:
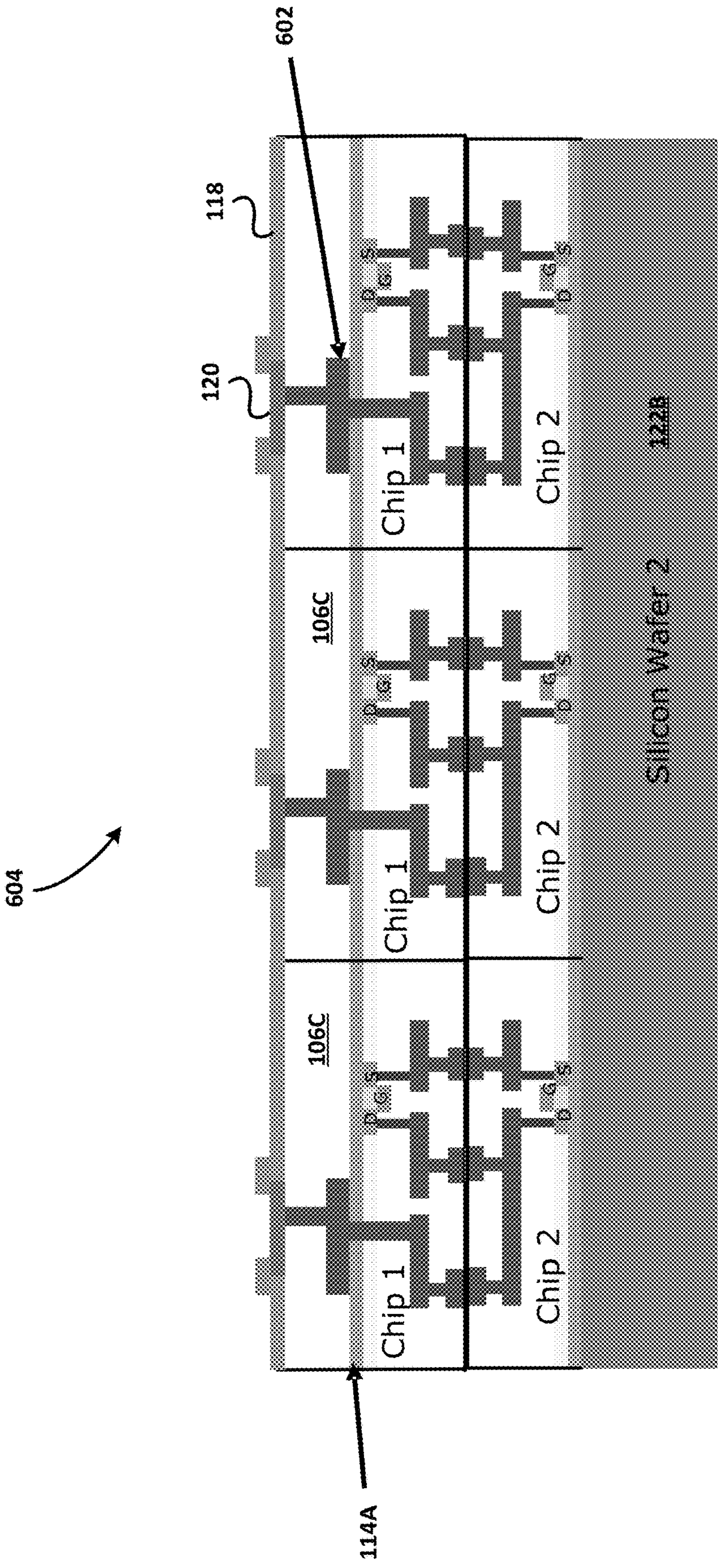
FIG. 21 is a cross-sectional view of the 3D-IC of FIG. 20 illustrating a process step of an example manufacturing process.

FIG. 20 is a cross-sectional view of a sixth 3D-IC 600 for use in RF applications, according to a sixth embodiment. In the sixth embodiment an additional metallization 602 above the first BOX layer 114A of chip 1 is used. The additional metallization 602 is formed in an additional dielectric layer 106C located between first BOX layer 114A and passivation layer 118. Additional metal layers above first BOX layer 114A can also be used, as well as additional dielectric layers if desired. FIG. 21 is a cross-sectional view of the 3D-IC 600 associated with an intermediate step 604 in which the silicon wafer 2 122B is shown. In the sixth embodiment, handling wafer 1 (not shown in FIG. 21) is removed by grinding and/or etching down to first BOX layer 114A. After the handling wafer is removed, additional metallization 602 including metal interconnects, vias, and additional dielectric layer 106C are deposited and structured. After the dielectric layers and metallization layers are formed, the pad-metallization for pads 120 is deposited and structured. After the pad-metallization for pads 120 is formed, passivation layer 118 is deposited and structured.

Example embodiments of the present invention are summarized here. Other embodiments can also be understood from the entirety of the specification and the claims filed herein.

Example 1. According to an embodiment, a three-dimensional integrated circuit comprises a first integrated circuit comprising at least a first transistor and a first buried oxide layer; a second integrated circuit comprising at least a second transistor and a second buried oxide layer; a bond interface between an upper surface of the first integrated circuit and an upper surface of the second integrated circuit; a passivation layer coupled to the first buried oxide layer; and a mold wafer coupled to the second buried oxide layer.

Example 2. The three-dimensional integrated circuit of Example 1, further comprises a first heat spreader layer interposed between the first buried oxide layer and the passivation layer; and a second heat spreader layer interposed between the second buried oxide layer and the mold wafer.

Example 3. The three-dimensional integrated circuit of any of the above examples, wherein at least one of the first heat spreader layer and the second heat spreader layer comprises aluminum nitride (AlN), Aluminum Oxide ($Al_2O_3$), or a diamond-like coating.

Example 4. The three-dimensional integrated circuit of any of the above examples, further comprising a porous silicon layer interposed between the second buried oxide layer and the mold wafer.

Example 5. The three-dimensional integrated circuit of any of the above examples, wherein the porous silicon layer comprises first and second crystalline silicon end portions.

Example 6. The three-dimensional integrated circuit of any of the above examples, further comprising a partially removed silicon layer interposed between the second buried oxide layer and the mold wafer, wherein the partially removed silicon layer comprises first and second crystalline silicon end portions.

Example 7. The three-dimensional integrated circuit of any of the above examples, further comprising a heat pipe, and wherein the heat pipe comprises a first portion extending through the first integrated circuit, and a second portion extending at least partially into the second integrated circuit.

Example 8. The three-dimensional integrated circuit of any of the above examples, further comprising a dielectric layer interposed between the first buried oxide layer and the passivation layer.

Example 9. The three-dimensional integrated circuit of any of the above examples, further comprising metal wiring extending through the dielectric layer.

Example 10. According to an embodiment, a three-dimensional integrated circuit comprises a first integrated circuit comprising at least a first transistor and a first buried oxide layer; a second integrated circuit comprising at least a second transistor and a second buried oxide layer; a bond interface between an upper surface of the first integrated circuit and an upper surface of the second integrated circuit; a passivation layer coupled to the first buried oxide layer; and an insulating substrate layer coupled to the second buried oxide layer, wherein the insulating substrate layer comprises aluminum nitride (AlN), aluminum oxide ($Al_2O_3$), or glass.

Example 11. According to an embodiment, a method for fabricating a three-dimensional integrated circuit comprises fabricating a first silicon wafer having a plurality of first integrated circuits; fabricating a second silicon wafer having a plurality of second integrated circuits; polishing an upper surface of the first silicon wafer; polishing an upper surface of the second silicon wafer; bonding the upper surface of the first silicon wafer to the upper surface of the second silicon wafer; removing a portion of the first silicon wafer to expose a first buried oxide layer; attaching an intermediate handling wafer to the first silicon wafer; removing a portion of the second silicon wafer to expose a second buried oxide layer; and attaching a mold wafer to the second silicon wafer.

Example 12. The method of Example 11, further comprising removing the intermediate handling wafer; and singularization of the bonded first and second integrated circuits and the mold wafer to provide a plurality of three-dimensional integrated circuits.

Example 13. The method of any of the above examples, further comprising forming a first heat spreader layer coupled to the first buried oxide layer; and forming a second heat spreader layer coupled to the second buried oxide layer.

Example 14. The method of any of the above examples, wherein forming at least one of the first heat spreader layer and forming the second heat spreader layer comprises forming a layer of aluminum nitride (AlN), Aluminum Oxide ($Al_2O_3$), or a diamond-like coating.

Example 15. The method of any of the above examples, further comprising forming a porous silicon layer interposed between the second buried oxide layer and the mold wafer, wherein the porous silicon layer comprises first and second crystalline silicon end portions.

Example 16. The method of any of the above examples, further comprising forming a partially removed silicon layer interposed between the second buried oxide layer and the mold wafer.

Example 17. The method of any of the above examples, wherein the partially removed silicon layer comprises first and second crystalline silicon end portions.

Example 18. The method of any of the above examples, further comprising forming a heat pipe, and wherein the heat pipe comprises a first portion extending through the plurality of first integrated circuits, and a second portion extending at least partially into the plurality of second integrated circuits.

Example 19. The method of any of the above examples, further comprising forming a dielectric layer coupled to a bottom surface of the first buried oxide layer.

Example 20. The method of any of the above examples, further comprising metal wiring extending through the dielectric layer.

PARTS LIST

100 First 3D-IC
102A Chip 1
102B Chip 2
104 Mold wafer
106A Dielectric layer 1
106B Dielectric layer 2
108 Bond interface
110A Metal wiring chip 1
110B Metal wiring chip 2
112A STI 1
112B STI 2
114A First BOX layer
114B Second BOX layer
116A RF-Transistor
116B RF-Transistor
118 Passivation layer
120 Pad
150 Step one
122A Silicon wafer 1
122B Silicon wafer 2
124 Top surface
152 Second processing step
154 Third processing step
156 Step four
158 Step five
126 Glue layer
128 Intermediate handling layer
160 Step six
162 Step seven
164 Step eight
200 Second 3D-IC
202A First heat spreader layer
202B Second heat spreader layer
204 Intermediate step
206 Intermediate step
300 Third 3D-IC
302 Backside contact
304 Porous silicon layer
306 Intermediate step
308 Implementation 3A
310 Crystalline silicon
312 Intermediate step
400 Fourth 3D-IC
402 Cavity
404 Intermediate step
500 Fifth 3D-IC
502 Heat-pipe
600 Sixth 3D-IC
602 Additional metallization
604 Intermediate step
106C Additional dielectric layer While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A three-dimensional integrated circuit comprising:
a first integrated circuit comprising at least a first transistor and a first buried oxide layer;
a second integrated circuit comprising at least a second transistor and a second buried oxide layer;
a bond interface between an upper surface of the first integrated circuit and an upper surface of the second integrated circuit;
a passivation layer coupled to the first buried oxide layer; and
a mold wafer coupled to the second buried oxide layer.

2. The three-dimensional integrated circuit of claim 1, further comprising:
a first heat spreader layer interposed between the first buried oxide layer and the passivation layer; and
a second heat spreader layer interposed between the second buried oxide layer and the mold wafer.

3. The three-dimensional integrated circuit of claim 2, wherein at least one of the first heat spreader layer and the second heat spreader layer comprises aluminum nitride (AlN), aluminum oxide ($Al_2O_3$), or a diamond-like coating.

4. The three-dimensional integrated circuit of claim 1, further comprising:
a porous silicon layer interposed between the second buried oxide layer and the mold wafer.

5. The three-dimensional integrated circuit of claim 4, wherein the porous silicon layer comprises first and second crystalline silicon end portions.

6. The three-dimensional integrated circuit of claim 1, further comprising:
a partially removed silicon layer interposed between the second buried oxide layer and the mold wafer, wherein the partially removed silicon layer comprises first and second crystalline silicon end portions.

7. The three-dimensional integrated circuit of claim 1, further comprising a heat pipe, and wherein the heat pipe comprises a first portion extending through the first integrated circuit, and a second portion extending at least partially into the second integrated circuit.

8. The three-dimensional integrated circuit of claim 1, further comprising a dielectric layer interposed between the first buried oxide layer and the passivation layer.

9. The three-dimensional integrated circuit of claim 8, further comprising metal wiring extending through the dielectric layer.

10. A three-dimensional integrated circuit comprising:
a first integrated circuit comprising at least a first transistor and a first buried oxide layer;
a second integrated circuit comprising at least a second transistor and a second buried oxide layer;
a bond interface between an upper surface of the first integrated circuit and an upper surface of the second integrated circuit;
a passivation layer coupled to the first buried oxide layer; and
an insulating substrate layer coupled to the second buried oxide layer, wherein the insulating substrate layer comprises aluminum nitride (AlN), aluminum oxide ($Al_2O_3$), or glass.

11. A method for fabricating a three-dimensional integrated circuit, the method comprising:

fabricating a first silicon wafer having a plurality of first integrated circuits each comprising at least a first transistor;

fabricating a second silicon wafer having a plurality of second integrated circuits each comprising at least a second transistor;

polishing an upper surface of the first silicon wafer;

polishing an upper surface of the second silicon wafer;

bonding the upper surface of the first silicon wafer to the upper surface of the second silicon wafer;

removing a portion of the first silicon wafer to expose a first buried oxide layer;

attaching an intermediate handling wafer to the first silicon wafer;

removing a portion of the second silicon wafer to expose a second buried oxide layer; and attaching a mold wafer to the second silicon wafer.

12. The method of claim 11, further comprising:

removing the intermediate handling wafer; and singularization of the bonded first and second integrated circuits and the mold wafer to provide a plurality of three-dimensional integrated circuits.

13. The method of claim 11, further comprising:

forming a first heat spreader layer coupled to the first buried oxide layer; and forming a second heat spreader layer coupled to the second buried oxide layer.

14. The method of claim 13, wherein forming at least one of the first heat spreader layer and forming the second heat spreader layer comprises forming a layer of aluminum nitride (AlN), aluminum oxide ($Al_2O_3$), or a diamond-like coating.

15. The method of claim 11, further comprising:

forming a porous silicon layer interposed between the second buried oxide layer and the mold wafer, wherein the porous silicon layer comprises first and second crystalline silicon end portions.

16. The method of claim 11, further comprising:

forming a partially removed silicon layer interposed between the second buried oxide layer and the mold wafer.

17. The method of claim 16, wherein the partially removed silicon layer comprises first and second crystalline silicon end portions.

18. The method of claim 11, further comprising forming a heat pipe, and wherein the heat pipe comprises a first portion extending through the plurality of first integrated circuits, and a second portion extending at least partially into the plurality of second integrated circuits.

19. The method of claim 11, further comprising forming a dielectric layer coupled to a bottom surface of the first buried oxide layer.

20. The method of claim 19, further comprising metal wiring extending through the dielectric layer.

* * * * *